(12) United States Patent
Sakama et al.

(10) Patent No.: US 6,632,708 B2
(45) Date of Patent: Oct. 14, 2003

(54) SEMICONDUCTOR DEVICE AND METHOD OF MANUFACTURING THE SAME

(75) Inventors: Mitsunori Sakama, Kanagawa (JP); Noriko Ishimaru, Kanagawa (JP); Masahiko Miwa, Nara (JP); Mitinori Iwai, Nara (JP)

(73) Assignees: Semiconductor Energy Laboratory Co., Ltd., Kanagawa-ken (JP); Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/739,269

(22) Filed: Dec. 19, 2000

(65) Prior Publication Data

US 2001/0004121 A1 Jun. 21, 2001

(51) Int. Cl.⁷ .............................. H01L 21/84
(52) U.S. Cl. .................. 438/149; 438/166; 438/517; 438/200
(58) Field of Search ................ 438/149, 150, 438/479, 480, 387, 153, 517, 287, 775, 786, 591, 166, 157, 200

(56) References Cited

U.S. PATENT DOCUMENTS

| | | | |
|---|---|---|---|
| 5,643,826 A | | 7/1997 | Ohtani et al. |
| 5,923,962 A | | 7/1999 | Ohtani et al. |
| 6,087,229 A | * | 7/2000 | Aronowitz et al. ......... 438/287 |
| 6,338,990 B1 | * | 1/2002 | Yanai et al. ................ 438/160 |
| 6,380,046 B1 | * | 4/2002 | Yamazaki .................. 438/409 |
| 6,461,899 B1 | * | 10/2002 | Kitakado et al. ........... 438/149 |
| 6,475,845 B2 | * | 11/2002 | Kimura ...................... 438/200 |
| 2001/0011725 A1 | | 8/2001 | Sakama et al. |

FOREIGN PATENT DOCUMENTS

| | | |
|---|---|---|
| JP | 07-130652 | 5/1995 |
| JP | 08-078329 | 3/1996 |
| JP | 10-135468 | 5/1998 |
| JP | 10-135469 | 5/1998 |

OTHER PUBLICATIONS

M. Modreanu et al., "Physical–Optical Properties of LPCVD Amorphous Silicon Rich–Nitride and Oxynitrdie", IEEE 1998, pp. 201–204.*

Bona et al., Versatile Silicon–Oxynitride Planar Lightwave Circuits for Interconnect Applications, IEEE 1999, pp. 145–148.*

Coluzza et al., Silicon Oxynitride and Cilicon Oxynitride––Silicon Interface: A Photoemission Study, IEEE 1989, pp. 2821–2824.*

* cited by examiner

Primary Examiner—Wael Fahmy
Assistant Examiner—(Vikki) Hoa B. Trinh
(74) Attorney, Agent, or Firm—Eric J. Robinson; Robinson Intellectual Property Law Office, P.C.

(57) ABSTRACT

To a provide a method of forming a layered film of a silicon nitride film and a silicon oxide film on a glass substrate in a short time without requiring a plurality of film deposition chambers. In a thin film transistor, a layered film including a silicon nitride oxide film (12) is formed between a semiconductor layer (13) and a substrate (11) using the same chamber. The silicon nitride oxide film has a continuously changing composition ration of nitrogen or oxygen. An electric characteristic of the TFT is thus improved.

16 Claims, 15 Drawing Sheets

155 first interlayer insulating film  156 first interlayer insulating film  157-159 source electrode
160,161 drain electrode  162,165,170,171 channel forming region  163 third impurity region(source)
164 third impurity region(drain)  166,167,172-175 second impurity region(LDD region)
168,176 first impurity region(source)  169,177 first impurity region(drain)  178 low impurity region 11 substrate
12 silicon nitride oxide film
13 semiconductor film 21 substrate
22 first insulating film
23 silicon nitride oxide film
24 semiconductor film 31 substrate
32 silicon nitride oxide film
33 second insulating film
34 semiconductor film 41 substrate
42 first insulating film
43 silicon nitride oxide film
44 second insulating film
45 semiconductor film 51 substrate
52 first insulating film
53 silicon nitride oxide film
54 second insulating film
55 silicon oxide film
56 semiconductor film 101 substrate  102 base film  103-105 semiconductor film  107-111 resist mask

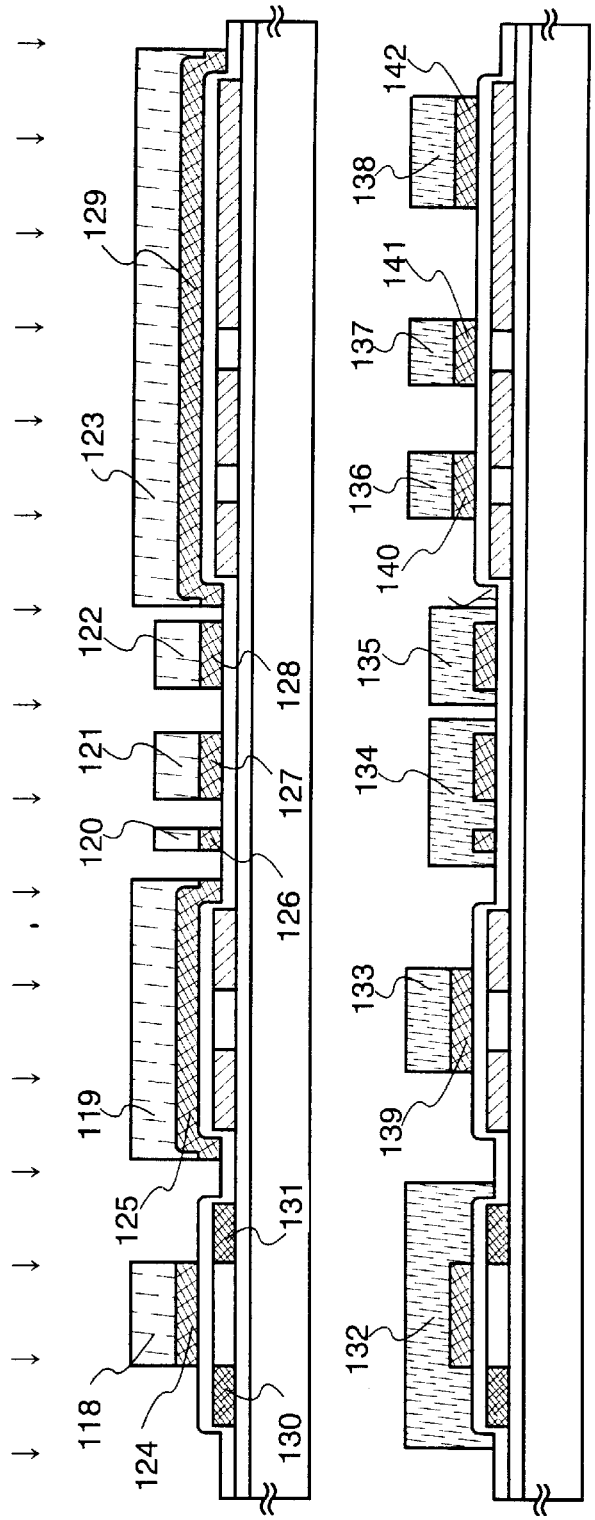
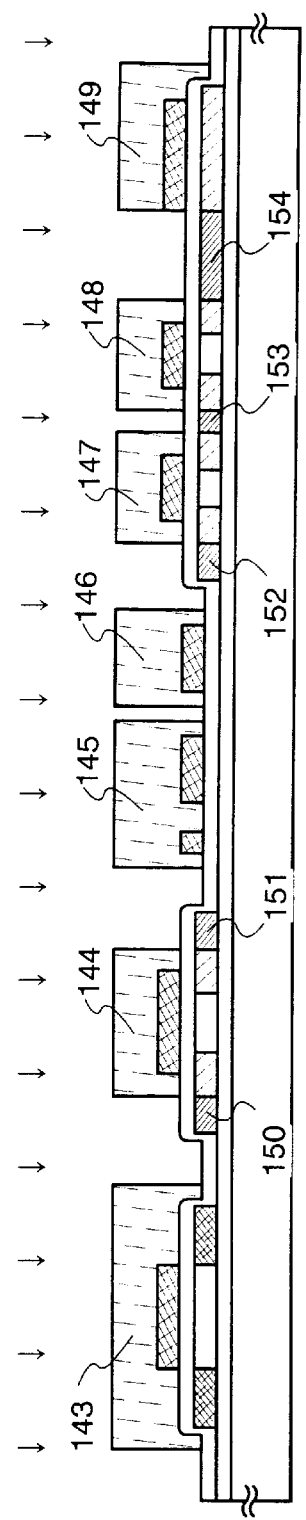
Fig. 7A
Fig. 7B
Fig. 7C
118-123 resist mask  124, 139-141 gate electrode  126 gate wiring  127, 128 gate bus line
132-138 resist mask  142 capacitance electrode  143-149 resist mask

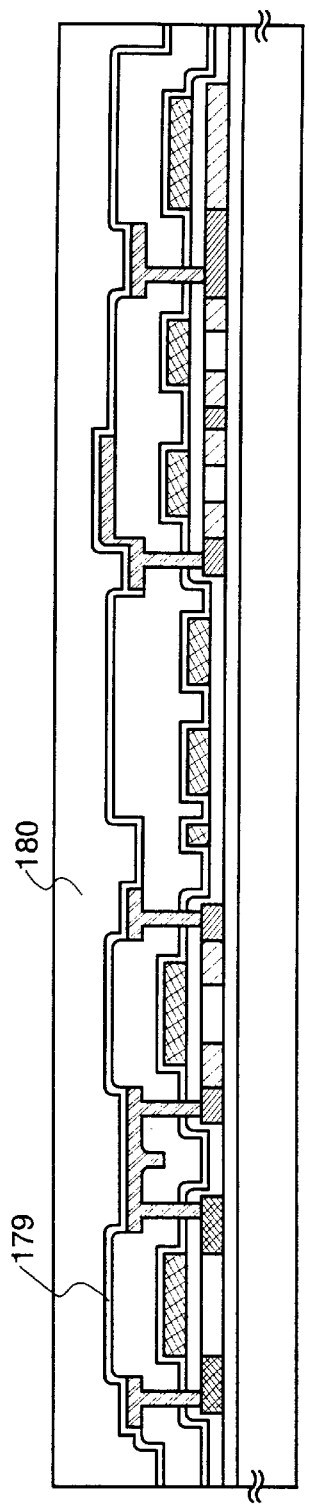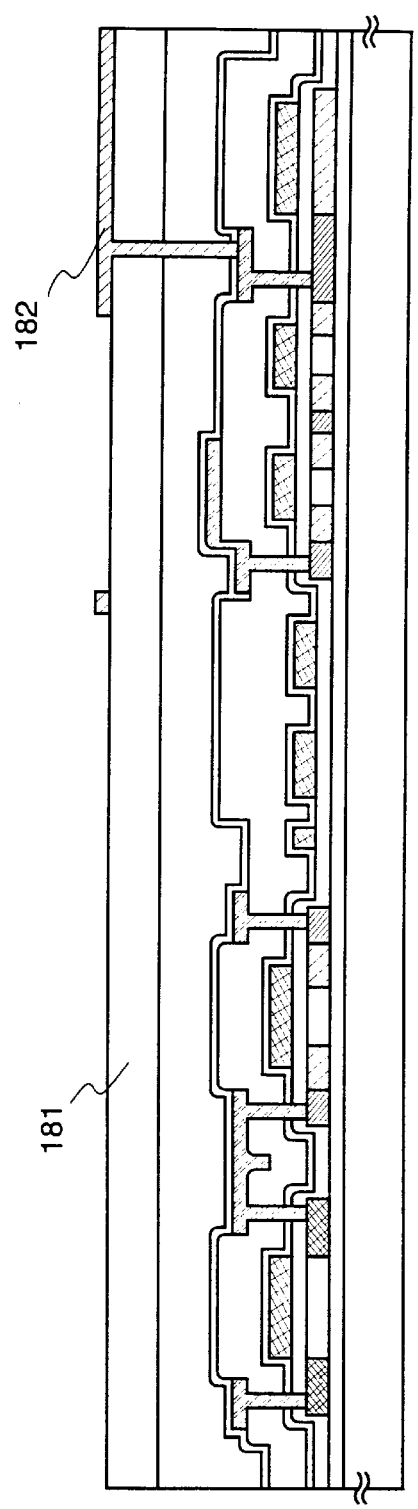
Fig. 9A
Fig. 9B

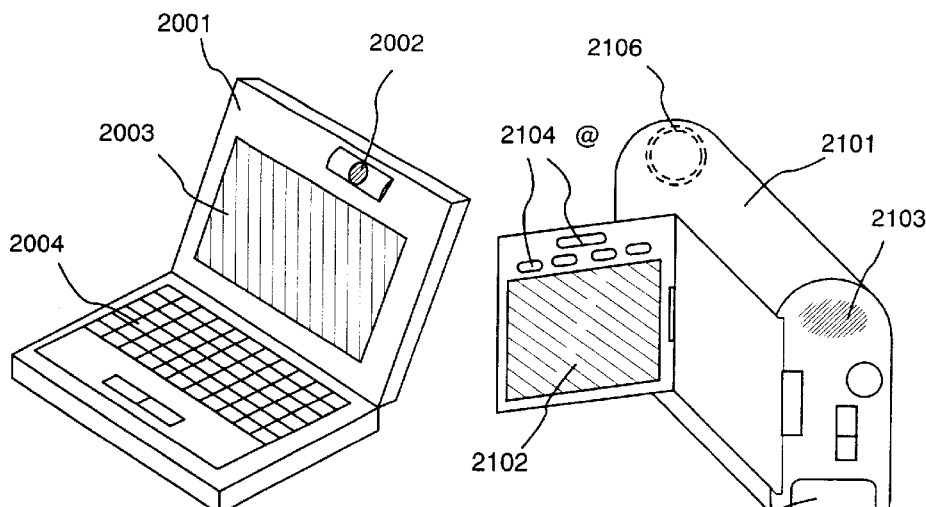
Fig. 16A
Fig. 16B
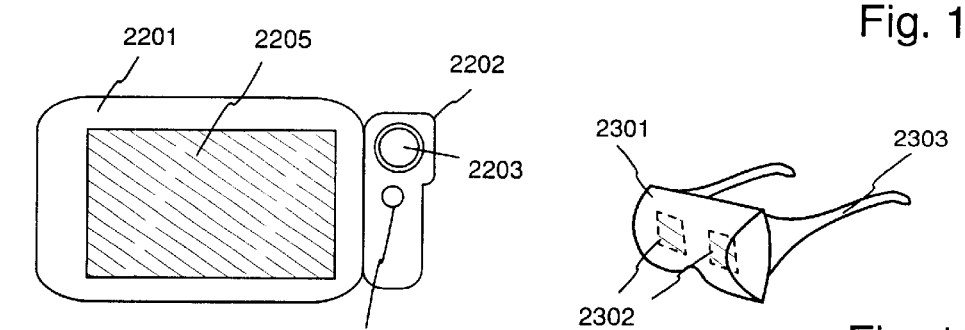
Fig. 16C
Fig. 16D
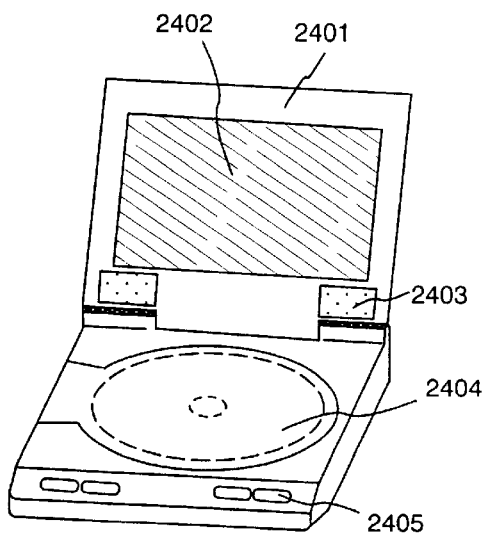
Fig. 16E
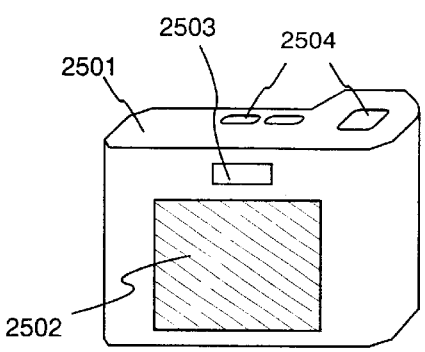
Fig. 16F 11 substrate
1012,1013 load lock chambers
1016-1019 gate valves
1020 robot arm
1021,1022 cassette

SEMICONDUCTOR DEVICE AND METHOD OF MANUFACTURING THE SAME

BACKGROUND OF THE INVENTION

1. Field of the Invention

The present invention relates to a semiconductor device having a circuit constructed of a thin film transistor (hereinafter referred to as TFT) and a method of manufacturing the same. For example, the present invention relates to an electro-optical device typified by a liquid crystal display panel and to electronic equipment having such an electro-optical device mounted thereon as its component.

It is to be noted that a semiconductor device as stated herein throughout the present specification denotes a general device which functions by utilizing semiconductor characteristics, and that electro-optical devices, semiconductor circuits, and electronic equipments are all semiconductor devices.

2. Description of the Related Art

A technique for structuring a thin film transistor (TFT) using a semiconductor thin film (having a thickness on the order of about several to several hundred nm) formed on a substrate having an insulating surface has been attracting much attention in recent years. Thin film transistors are widely applied to electronic devices such as an IC or an electro-optical device, and in particular, development of the TFT as a switching element of an image display device is proceeding rapidly.

Typically, an amorphous silicon film, a crystalline silicon film formed from an amorphous silicon film that is crystallized by a known method such as laser light annelaing, or like other film is used as a material of the semiconductor thin film. In particular, the TFT using the crystalline silicon film as an active layer realizes a high electric field mobility, and hence its ability in current driving is high, making it possible to perform fine processing and increasing an aperture ratio of a pixel portion.

An active matrix liquid crystal display device that utilizes such TFTs as switching elements of pixels and as driver circuits is attracting much attention. Utilizing an inexpensive glass substrate rather than an expensive quartz substrate becomes the premise to realize an inexpensive as well as a large screen display device. Furthermore, it is demanded that the highest temperature in a manufacturing process be set at 600 to 700° C. or lower when taking the heat resistance temperature of the glass substrate in consideration.

However, a large quantity of impurity ions of alkali metal such as sodium (Na), or other impurities are contained in the glass substrate. A base film (blocking layer) formed from a silicon oxide film, a silicon nitride film, or the like is therefore formed on the surface of the glass substrate on which the TFTs will be formed in order to prevent the impurity ions of the alkali metal element, etc. from penetrating into the active layer of the TFT.

An electric field is formed in the active layer when a voltage is applied to a gate electrode of the TFT, whereby the impurity ions in the glass substrate are drawn to the active layer. As a result, if the impurity ions pass through the base film and penetrate into a gate insulating film and the active layer, then an electrical characteristic will undergo a fluctuation, thereby leading to the reduction in reliability.

In the case of a top gate TFT, in particular, the film quality of the base film influences the characteristic of the TFT immensely because a channel forming region is in contact with the base film.

Conventionally, the silicon nitride ($SiN_x$) film and the silicon oxide ($SiO_x$) film are generally used as the base film. Although it is known that an insulating film formed from the silicon nitride ($SiN_x$) film is high in its blocking effect of impurity ions, the insulating film has a great number of trap levels and therefore has a huge influence on the characteristic of the TFT. In addition, the silicon oxide film has merits such as a wider band gap, a higher insulation, and a lower trap level compared with the silicon nitride film. The silicon oxide film, however, has demerits in that it is apt to absorb moisture and also has a low blocking effect of impurity ions.

Besides, in the case of using a layered film of the silicon nitride ($SiN_x$) film and the silicon oxide ($SiO_x$) film as the base film, it is also known that the layered film has an effect on improvement in stability of the TFT characteristic.

When forming the layered film formed of the silicon nitride film and the silicon oxide film on the glass substrate, two film deposition chambers were necessary to exclusively form these films individually because the composition elements of the silicon nitride film and the silicon oxide film are respectively different.

Furthermore, in the case of using two film deposition chambers to form the layered film, a conveying time when conveying the substrate and a heating time for heating the substrate which has grown cold while being conveyed are required, thereby inviting an increase in the processing time.

SUMMARY OF THE INVENTION

The present invention has been made to solve the above problem, and therefore has an object to provide a base film formation method having excellent productivity and a base film attained through this formation method.

According to a first aspect of the present invention, there is provided a semiconductor device having a thin film transistor, characterized in that the semiconductor device comprises an insulating film in contact with a substrate and a semiconductor film on the insulating film and in contact thereto, and that the insulating film is a silicon nitride oxide film in which a concentration ratio of nitrogen to a concentration of silicon in the film undergoes a continuous change within a range of 0.3 or more and 1.6 or less. Therefore, from TFT characteristics so far, remarkable progress can be made in an electric characteristic of a TFT using the semiconductor film that is in contact with the silicon nitride oxide film as an active layer.

According to a second aspect of the present invention, there is provided a semiconductor device having a thin film transistor, characterized in that the semiconductor device comprises a layered film including an insulating film in contact with a substrate and a semiconductor film on the insulating film and in contact thereto, and that the insulating film is a silicon nitride oxide film in which a concentration ratio of oxygen to a concentration of silicon in the film undergoes a continuous change within a range of 0.1 or more and 1.7 or less. Therefore, from TFT characteristics so far, remarkable progress can be made in an electric characteristic of a TFT using the semiconductor film that is in contact with the silicon nitride oxide film as an active layer.

According to a third aspect of the present invention, there is provided a semiconductor device having a thin film transistor, characterized in that the semiconductor device comprises an insulating film in contact with a substrate and a semiconductor film on the insulating film and in contact thereto; and that the insulating film is a silicon nitride oxide film in which a concentration ratio of nitrogen to a concentration of silicon in the film undergoes a continuous change within a range of 0.3 or more and 1.6 or less and a concentration ratio of oxygen to a concentration of silicon in the film undergoes a continuous change within a range of 0.1 or more and 1.7 or less. Therefore, from TFT characteristics so far, remarkable progress can be made in an electric characteristic of a TFT using the semiconductor film that is in contact with the silicon nitride oxide film as an active layer.

According to a fourth aspect of the present invention, there is provided a semiconductor device having a thin film transistor, characterized in that the semiconductor device comprises a layered film including a silicon nitride oxide film in contact with a substrate and a semiconductor film on the layered film and in contact thereto, and that the layered film including the silicon nitride oxide film includes one layer of film in which a concentration ratio of nitrogen to a concentration of silicon in the film undergoes a continuous change within a range of 0.3 or more and 1.6 or less. Therefore, from TFT characteristics so far, remarkable progress can be made in an electric characteristic of a TFT using the semiconductor film that is formed on a base film containing the silicon nitride oxide film as an active layer.

According to a fifth aspect of the present invention, there is provided a semiconductor device having a thin film transistor, characterized in that the semiconductor device comprises a layered film including a silicon nitride oxide film in contact with a substrate and a semiconductor film on the layered film and in contact thereto, and that the layered film including the silicon nitride oxide film includes one layer of film in which a concentration ratio of oxygen to a concentration of silicon in the film undergoes a continuous change within a range of 0.1 or more and 1.7 or less. Therefore, from TFT characteristics so far, remarkable progress can be made in an electric characteristic of a TFT using the semiconductor film that is formed on a base film containing the silicon nitride oxide film as an active layer.

According to a sixth aspect of the present invention, there is provided a semiconductor device having a thin film transistor, characterized in that the semiconductor device comprises a silicon nitride oxide film in contact with a substrate, a silicon oxide film on the silicon nitride oxide film and in contact thereto, and a semiconductor film on the silicon oxide film and in contact thereto, and that the silicon nitride oxide film is a film in which a concentration ratio of nitrogen to a concentration of silicon in the film undergoes a continuous change within a range of 0.3 or more and 1.6 or less. Therefore, from TFT characteristics so far, remarkable progress can be made in an electric characteristic of a TFT using the semiconductor film that is formed on a base film containing the silicon nitride oxide film as an active layer.

According to a seventh aspect of the present invention, there is provided a semiconductor device having a thin film transistor, characterized in that the semiconductor device comprises a silicon nitride oxide film in contact with a substrate, a silicon oxide film on the silicon nitride oxide film and in contact thereto, and a semiconductor film on the silicon oxide film and in contact thereto; and that the silicon nitride oxide film is a film in which a concentration ratio of oxygen to a concentration of silicon in the film undergoes a continuous change within a range of 0.1 or more and 1.7 or less. Therefore, from TFT characteristics so far, remarkable progress can be made in an electric characteristic of a TFT using the semiconductor film that is formed on a base film containing the silicon nitride oxide film as an active layer.

According to an eighth aspect of the present invention, the semiconductor device as set forth in any one of the first to seventh aspects of the present invention is characterized in that the nitrogen concentration in the silicon nitride oxide film continuously decreases toward an interface of the semiconductor film side.

According to a ninth aspect of the present invention, the semiconductor device as set forth in any one of the first to eighth aspects of the present invention is characterized in that the oxygen concentration in the silicon nitride oxide film continuously increases toward an interface of the semiconductor film side.

Further, according to a tenth aspect of the present invention, in order to realize any one of the first to ninth aspects of the present invention, there is provided a method of manufacturing a semiconductor device, characterized by comprising a step of forming a silicon nitride oxide film in which a concentration ratio of nitrogen to a concentration of silicon in the film undergoes a continuous change within a range of 0.3 or more and 1.6 or less by continuously altering a gas flow rate within a fixed period.

Further, according to an eleventh aspect of the present invention, there is provided a method of manufacturing a semiconductor device, characterized by comprising a step of forming a silicon nitride oxide film in which a concentration ratio of oxygen to a concentration of silicon in the film undergoes a continuous change within a range of 0.1 or more and 1.7 or less by continuously altering a gas flow rate within a fixed period.

Further, according to a twelfth aspect of the present invention, there is provided a method of manufacturing a semiconductor device, characterized by comprising a step of forming a silicon nitride oxide film in which a concentration ratio of nitrogen to a concentration of silicon in the film undergoes a continuous change within a range of 0.3 or more and 1.6 or less by continuously altering a gas ratio within a fixed period.

Further, according to a thirteenth aspect of the present invention, there is provided a method of manufacturing a semiconductor device, characterized by comprising a step of forming a silicon nitride oxide film in which a concentration ratio of oxygen to a concentration of silicon in the film undergoes a continuous change within a range of 0.1 or more and 1.7 or less by continuously altering a gas ratio within a fixed period.

Further, according to a fourteenth aspect of the present invention, there is provided a method of manufacturing a semiconductor device, characterized by comprising a step of forming a silicon nitride oxide film in which a concentration ratio of nitrogen to a concentration of silicon in the film undergoes a continuous change within a range of 0.3 or more and 1.6 or less by continuously altering an RF output within a fixed period.

Further, according to a fifteenth aspect of the present invention, there is provided a method of manufacturing a semiconductor device, characterized by comprising a step of forming a silicon nitride oxide film in which a concentration ratio of oxygen to a concentration of silicon in the film undergoes a continuous change within a range of 0.1 or more and 1.7 or less by continuously altering an RF output within a fixed period.

Further, according to a sixteenth aspect of the present invention, there is provided a method of manufacturing a semiconductor device, characterized by comprising a step of forming a silicon nitride oxide film in which a concentration ratio of nitrogen to a concentration of silicon in the film undergoes a continuous change within a range of 0.3 or more and 1.6 or less and a semiconductor film consecutively in the same film deposition chamber.

Further, according to a seventeenth aspect of the present invention, there is provided a method of manufacturing a semiconductor device, characterized by comprising a step of forming a silicon nitride oxide film in which a concentration ratio of oxygen to a concentration of silicon in the film undergoes a continuous change within a range of 0.1 or more and 1.7 or less and a semiconductor film consecutively in the same film deposition chamber.

Further, according to an eighteenth aspect of the present invention, there is provided a method of manufacturing a semiconductor device, characterized by comprising a step of forming an insulating film, a silicon nitride oxide film in which a concentration ratio of nitrogen to a concentration of silicon in the film undergoes a continuous change within a range of 0.3 or more and 1.6 or less, and a semiconductor film consecutively in the same film deposition chamber.

Further, according to a nineteenth aspect of the present invention, there is provided a method of manufacturing a semiconductor device, characterized by comprising a step of forming an insulating film, a silicon nitride oxide film in which a concentration ratio of oxygen to a concentration of silicon in the film undergoes a continuous change within a range of 0.1 or more and 1.7 or less, and a semiconductor film consecutively in the same film deposition chamber.

Further, according to a twentieth aspect of the present invention, there is provided a method of manufacturing a semiconductor device, characterized by comprising a step of forming a silicon nitride oxide film in which a concentration ratio of nitrogen to a concentration of silicon in the film undergoes a continuous change within a range of 0.3 or more and 1.6 or less, an insulating film, and a semiconductor film consecutively in the same film deposition chamber.

Further, according to a twenty-first aspect of the present invention, there is provided a method of manufacturing a semiconductor device, characterized by comprising a step of forming a silicon nitride oxide film in which a concentration ratio of oxygen to a concentration of silicon in the film undergoes a continuous change within a range of 0.1 or more and 1.7 or less, an insulating film, and a semiconductor film consecutively in the same film deposition chamber.

Further, according to a twenty-second aspect of the present invention, there is provided a method of manufacturing a semiconductor device, characterized by comprising a step of forming a first insulating film, a silicon nitride oxide film in which a concentration ratio of nitrogen to a concentration of silicon in the film undergoes a continuous change within a range of 0.3 or more and 1.6 or less, and a second insulating film consecutively in the same film deposition chamber.

Further, according to a twenty-third aspect of the present invention, there is provided a method of manufacturing a semiconductor device, characterized by comprising a step of forming a first insulating film, a silicon nitride oxide film in which a concentration ratio of oxygen to a concentration of Si in the film undergoes a continuous change within a range of 0.1 or more and 1.7 or less, a second insulating film, and a semiconductor film consecutively in the same film deposition chamber.

Further, according to a twenty-fourth aspect of the present invention, the method of manufacturing a semiconductor device as set forth in any one of the tenth to twenty-third aspects of the present invention is characterized in that the nitrogen concentration in the silicon nitride oxide film is continuously decreased toward an interface of the semiconductor film side.

Still further, according to a twenty-fifth aspect of the present invention, the method of manufacturing a semicon-ductor device as set forth in any one of the tenth to twenty-fourth aspects of the present invention is characterized in that the oxygen concentration in the silicon nitride oxide film is continuously increased toward an interface of the semiconductor film side.

BRIEF DESCRIPTION OF THE DRAWINGS

In the accompanying drawings:

FIGS. 7A to 7C are diagrams showing the manufacturing processes of the AM-LCD in accordance with Embodiment 6 of the present invention;

FIGS. 9A to 9B are diagrams showing the manufacturing processes of the AM-LCD in accordance with Embodiment 6 of the present invention;

FIGS. 16A to 16F are views showing examples of electronic equipments of Embodiment 9 of the present invention;

DETAILED DESCRIPTION OF THE PREFERRED EMBODIMENTS

Figure 1:
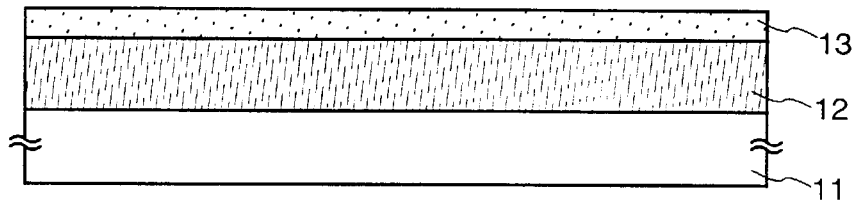
FIG. 1 is a diagram showing a manufacturing process in accordance with Embodiment 1 of the present invention.

Hereinafter, an embodiment mode of the present invention will be explained.

The present invention will provide a silicon nitride oxide film in which either a concentration ratio of nitrogen to a concentration of silicon in the film or a concentration of oxygen to the concentration of silicon in the film under a continuous change and a method of manufacturing thereof.

To be more specific, the concentration ratio of nitrogen to the concentration of silicon in the silicon nitride oxide film of the present invention undergoes a continuous change within a range of 0.3 or more and 1.6 or less. It is to be noted that preferably the nitrogen concentration in the silicon nitride oxide film formed in contact with a semiconductor film is continuously decreased toward an interface of the semiconductor film side. If the nitrogen concentration is high in an insulating film, then its insulating characteristic is reduced due to a great number of fixed electric charges. Therefore, the semiconductor film is formed contacting the insulating film so that when a TFT uses this semiconductor film as an active layer, it facilitates the forming of trap levels in the interface of the silicon nitride oxide film and the active layer.

Furthermore, the concentration ratio of oxygen to the concentration of silicon in the silicon nitride oxide film of the present invention undergoes a continuous change within a range of 0.1 or more and 1.7 or less. It is to be noted that preferably the oxygen concentration in the silicon nitride oxide film formed in contact with the semiconductor film is continuously increased toward the interface of the semiconductor film side.

The concentration ratio of the silicon nitride oxide film formed by the present invention is continuously changed, and therefore the silicon nitride oxide film has the same function as that of a layered film formed of a silicon nitride film and a silicon oxide film. In essence, because formation is conducted in the same reaction chamber, in addition to being able to reduce unevenness caused by contamination or the like during the conveying of a substrate, unevenness between lots and between substrates can be reduced together with improving productivity when compared with the conventional way of forming the layered film in individual reaction chambers.

The silicon nitride oxide film formed by the present invention also has effects in blocking impurities and improving the resistance of thermal stress by alleviating the influences due to the contraction of the substrate.

In the layered film of the silicon nitride film and the silicon oxide film, there is a problem in which the film peels off due to a stress developing in the interface between the films. However, the silicon nitride oxide film formed by the present invention is a single layer, and thus there is no existence of an interface. Therefore, drawbacks such as the peeling off of a film due to stress developing in the interface will not occur.

CVD methods such as plasma CVD, low pressure CVD, and ECR CVD may be employed to form the silicon nitride oxide film of the present invention. Furthermore, the silicon nitride oxide film of the present invention is characterized in that it is formed in one film deposition chamber. In the silicon nitride oxide film, the composition ratio of silicon, oxygen, nitrogen, and hydrogen is controlled by regulating a flow rate of source gas, a temperature of the substrate, pressure, an RF power, and an interval between electrodes. $SiH_4$, $N_2O$, and $NH_3$ are used as the source gases. Furthermore, $N_2$ may be added to these source gases. $Si_2H_6$ (disilane) can be used as the silicon source instead of $SiH_4$ (monosilane). $NH_3$ is for supplementing the effect of nitrogenating $N_2O$ (nitrous oxide), and hence the nitrogen concentration of the silicon nitride oxide film can be made higher by doping $NH_3$. $N_2O$, which is also the oxygen source, can be used instead of $NH_3$. Moreover, either $O_2$ or $O_3$ can be used as the oxygen source.

Note that in the case of forming the silicon nitride oxide film by a CVD method, the composition not only contains silicon, oxygen, and nitrogen, but hydrogen which is contained in the source gas is also included in the composition.

A base film in contact with the substrate is formed into a laminate structure, and thus in the case of using the silicon nitride oxide film of the present invention as at least one of the layers, relaxation of stress between the films themselves and improvement of the adherence between the films can be carried out.

Figure 2:
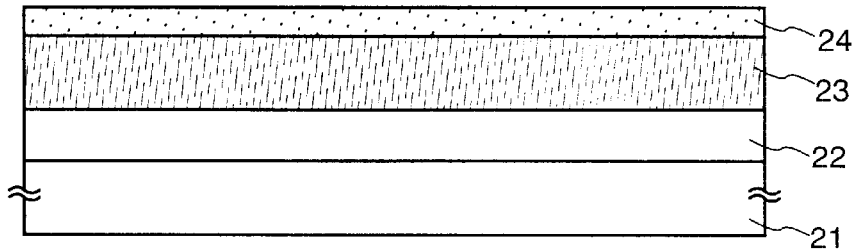
FIG. 2 is a diagram showing a manufacturing process in accordance with Embodiment 2 of the present invention.

For example, when the silicon nitride oxide film of the present invention is provided in contact with the semiconductor film as shown in FIG. 2, relaxation of stress and adherence between the insulating film formed under the silicon nitride oxide film of the present invention and the semiconductor film are improved.

Figure 3:
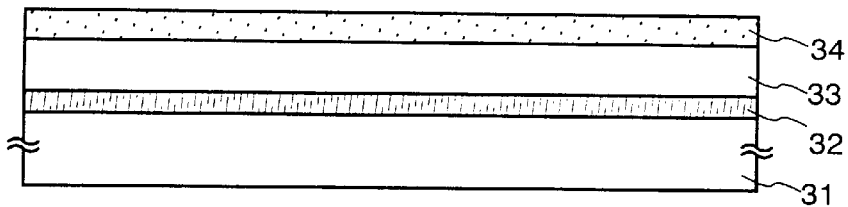
FIG. 3 is a diagram showing a manufacturing process in accordance with Embodiment 3 of the present invention.

Further, as shown in FIG. 3, in the case of providing the silicon nitride oxide film of the present invention in contact with the substrate, then the relaxation of stress and adherence between the insulating film formed on the silicon nitride oxide film of the present invention and the substrate are improved.

Figure 4:
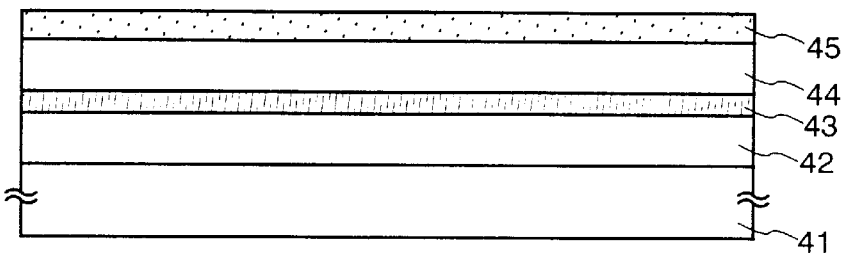
FIG. 4 is a diagram showing a manufacturing process in accordance with Embodiment 4 of the present invention.
Figure 5:
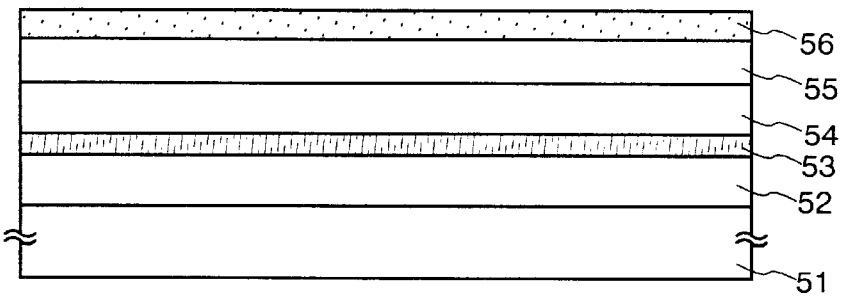
FIG. 5 is a diagram showing a manufacturing process in accordance with Embodiment 5 of the present invention.

Note that the silicon nitride oxide film of the present invention and the insulating film can be freely combined as shown in FIGS. 4 and 5.

A silicon oxide film or a silicon nitride film having silicon as its main constituent can be cited as the above-mentioned insulating film. Further, CVD methods such as plasma CVD, low pressure CVD, and ECR CVD can be used in the film deposition method of these films. In the source gases used in forming the silicon oxide film, an inorganic silane such as $SiH_4$ (monosilane) or $Si_2H_6$ (disilane) can be used as the silicon source, and $O_2$, $O_3$, or $N_2O$ can be used as the oxygen source.

A general silicon nitride oxide film can also be used as the above-mentioned insulating film. It is to be noted that in the general silicon nitride oxide film, the nitrogen concentration or the oxygen concentration in the film is roughly uniform in the direction of the film thickness, and hence does not have composition gradient. It is therefore a film that is entirely different from the silicon nitride oxide film of the present invention.

For example, as shown in FIG. 3, the general silicon nitride oxide film may be used as the insulating film to thereby form on the substrate a laminate layer of the silicon nitride oxide film of the present invention and the general silicon nitride oxide film.

Further, as shown in FIG. 4, the general silicon nitride oxide film may be used as a first insulating film and a second insulating film to thereby form a laminate layer on the substrate in the order of the first silicon nitride oxide film, the silicon nitride oxide film of the present invention, and the second silicon nitride oxide film. Also, it goes without saying that the silicon nitride oxide films can be freely combined as shown in FIG. 5.

The semiconductor film is formed in contact with the base film made from the above-described silicon nitride oxide film of the present invention or in contact with the base film formed from a laminate structure containing at least one layer of the silicon nitride oxide film of the present invention.

In the present invention, the semiconductor film is a non-single crystal semiconductor film, an amorphous semiconductor film, an amorphous semiconductor film having micro crystals, and a crystalline semiconductor film. The crystalline semiconductor film is a semiconductor film that has crystallinity, for example, a microcrystalline semiconductor film and a polycrystalline semiconductor film. Further, silicon, germanium, silicon germanium, a compound semiconductor film, etc. can be used as the semiconductor film. In the case of the amorphous semiconductor film, the semiconductor film having micro crystals, and the microcrystalline semiconductor film are formed, it is preferable that the crystallinity of these films are improved through heat treatment and laser irradiation to thereby be used as the active layer of the TFT.

Further, in order to prevent contamination of the substrate during conveyance, forming the above semiconductor film in succession with the base film is preferred. Contamination to the interface of the insulating film and the active layer can be prevented by forming the films in succession, resulting in facilitating the control of the characteristics of the TFT. In addition, by forming the above semiconductor film and the base film in succession, the process time is shortened, thereby improving productivity.

Therefore, from TFT characteristics so far, it is possible to make remarkable progress in the electric characteristic of the TFT using the semiconductor film that is formed on the base film containing the above-mentioned silicon nitride oxide film of the present invention as an active layer Hereinafter, embodiments of the present invention will be explained in more detail in regards to the present invention adopting the above structure.

[Embodiment 1]

An explanation on a process of manufacturing a silicon nitride oxide film that utilizes the present invention and a semiconductor film (crystalline silicon film in Embodiment 1) will be made. Embodiment 1 is shown in the following with reference to FIG. 1.

First of all, a silicon nitride oxide film 12 in which a concentration ratio of nitrogen to a concentration of silicon in the film or a ratio concentration of oxygen to a concentration of silicon in the film undergoing a continuous change is formed on a substrate 11.

Figure 19:
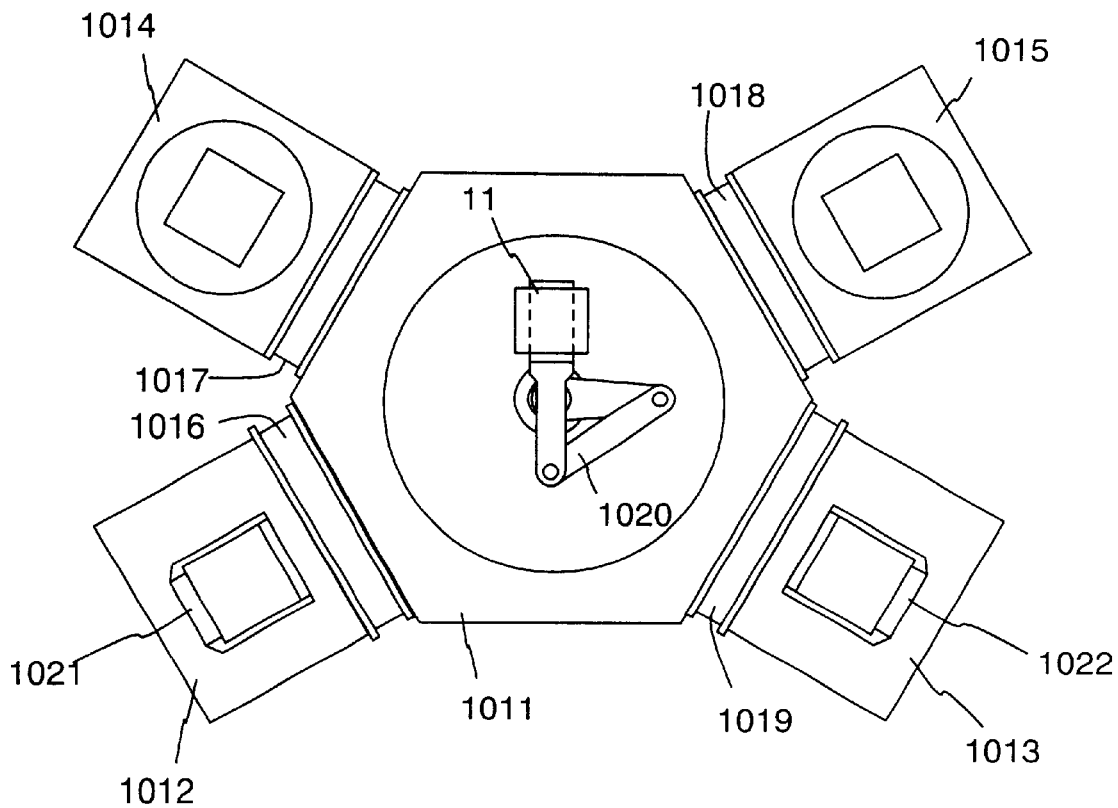
FIG. 19 is a view showing an example of a manufacturing device in accordance with Embodiment 1 of the present invention.

A sheet-fed style plasma CVD apparatus (composed of a substrate conveying chamber 1011, load lock chambers 1012 and 1013, a first film deposition chamber 1014, a second film deposition chamber 1015, gate valves 1016 to 1019, etc.) shown in FIG. 19 is utilized in Embodiment 1.

The substrate 11 is first set on a cassette 1021 of the load lock chamber 1023.

Next, the substrate 11 is conveyed to the first film deposition chamber 1014 to thereby heat the substrate so that the substrate temperature is approximately 320° C. The substrate 11 may be first heated by using a pre-heating chamber or the like before it is conveyed to the first film deposition chamber 1014.

A silicon nitride oxide film is next formed to a film thickness of 50 nm on the substrate. Conditions of the first film deposition are set as follows: an introducing amount of $SiH_4$ gas is set to about 80 sccm; an introducing amount of $N_2O$ gas is set to about 200 sccm; an introducing amount of $NH_3$ gas is set to about 720 sccm, a pressure inside the chamber is set to about 1.0 Torr, and an RF power that is to be inputted is set to about 1500 W. Subsequently, the conditions are continuously altered within a predetermined period so that they are changed from the conditions of the first film deposition to the conditions of the second film deposition.

Note that the conditions of the second film deposition are set as follows: the substrate temperature is set to 320° C., the introducing amount of $SiH_4$ gas is set to about 30 sccm; the introducing amount of $N_2O$ gas is set to about 3000 sccm, the pressure inside the chamber is set to about 1.0 Torr, and the RF power that is to be inputted is set to about 500 W.

The silicon nitride oxide film 12 in which the concentration ratio of nitrogen to the concentration of silicon in the film or the concentration ratio of oxygen to the concentration of silicon in the film undergoing a continuous change is thus obtained. The silicon nitride oxide film 12 has a composition gradient within its film, and therefore the nitrogen increases continuously toward an interface of the substrate side.

The substrate is next conveyed to the second film deposition chamber 1015 through the substrate conveying chamber after the gas in the first film deposition chamber 1014 is vacuum drawn or replaced with an inert gas such as $N_2$.

Thereafter, a semiconductor film 13, which is an amorphous silicon film here formed in the second film deposition chamber 1015, is formed in contact with the silicon nitride oxide film 12.

In Embodiment 1, because it is possible to form the silicon nitride oxide film 12 and the semiconductor film with the same film deposition method, both films may be formed in succession in the same chamber. Due to the fact that successive film deposition is performed, contamination may be prevented for a time during conveying of the substrate after the formation of the silicon nitride oxide film 12. As a result, characteristic irregularities of the manufactured TFTs can be reduced.

The substrate with the amorphous silicon film formed thereon is then conveyed to the load lock chamber 1012 through the substrate conveying chamber 1011 and set on a cassette 1022.

Next, a known crystallization technique is carried out to thereby form a crystalline semiconductor film on the substrate with the laminate layer of the silicon nitride oxide film 12 and the amorphous semiconductor film formed thereon.

Known techniques may be used for the remaining processes to form the TFT.

[Embodiment 2]

An explanation on a process of manufacturing the silicon nitride oxide film that utilizes the present invention and the semiconductor film (crystalline silicon film in Embodiment 2) will be made. Embodiment 2 is shown in the following with reference to FIG. 2.

First, after the formation of a first insulating film 22 on a substrate 21, the silicon nitride oxide film 12 (second insulating film) in which the concentration ratio of nitrogen to the concentration of silicon in the film or the concentration ratio of oxygen to the concentration of silicon in the film undergoes a continuous change is formed thereon.

The first insulating film 22 (a generic term as used herein throughout the present specification indicating a silicon oxide film, a silicon nitride film, or a silicon nitride oxide film) is formed on the substrate 21 and in contact thereto to a film thickness of between 10 and 400 nm by plasma CVD or sputtering.

Further, heat treatment may be performed after forming the first insulating film 22.

Next, similar to Embodiment 1, the conditions are continuously altered within a predetermined period so that they are changed from the conditions of the first film deposition to the conditions of the second film deposition thereby forming a silicon nitride oxide film 23.

In Embodiment 2, because it is possible to form the first insulating film 22 and the silicon nitride oxide film 23 with the same film deposition method, both films may be formed in succession in the same chamber.

Similar to Embodiment 1, a semiconductor film 24, which is formed from an amorphous silicon film here, is formed next in contact with the silicon nitride oxide film 23.

Furthermore, because it is possible to form the silicon nitride oxide film 23 and the semiconductor film with the same film deposition method here, both films may be formed in succession in the same chamber. After the formation of the silicon nitride oxide film 23, it becomes possible to prevent contamination or the like of the surface by not exposing the substrate to the open atmosphere for a time during the conveying of the substrate. As a result, characteristic irregularities of the manufactured TFTs can be reduced.

Thereafter, a known crystallization technique is carried out to thereby form a crystalline semiconductor film on the substrate with the laminate layer of the silicon nitride oxide film 23 and the amorphous semiconductor film formed thereon.

Known techniques may be used for the remaining processes to form the TFT.

[Embodiment 3]

An explanation on a process of manufacturing the silicon nitride oxide film that utilizes the present invention and the semiconductor film (crystalline silicon film in Embodiment 3) will be made. Embodiment 3 is shown in the following with reference to FIG. 3.

First, after the formation of a silicon nitride oxide film 32 (first insulating film) in which the concentration ratio of nitrogen to the concentration of silicon in the film or the concentration ratio of oxygen to the concentration of silicon in the film undergoes a continuous change is formed on a substrate 31, a second insulating film 33 is formed thereon, and then a semiconductor film 34 is further formed thereon.

Similar to Embodiment 1, the conditions are continuously altered within a predetermined period so that they are changed from the conditions of the first film deposition to the conditions of the second film deposition to thereby form a silicon nitride oxide film 32 in contact with the substrate.

Next, a silicon oxide film serving as the second insulating film 33 is formed on the silicon nitride oxide film 32. The second insulating film 33 (a generic term as used herein throughout the present specification indicating a silicon oxide film, a silicon nitride film, or a silicon nitride oxide film) is formed to a film thickness of between 100 and 400 nm by plasma CVD or sputtering.

Further, heat treatment may be performed after forming the second insulating film 33.

In Embodiment 3, because it is possible to form the second insulating film 33 and the silicon nitride oxide film 32 with the same film deposition method, both films may be formed in succession in the same chamber.

The semiconductor film, which is formed from an amorphous silicon film here, is formed next in contact with the silicon oxide film.

Furthermore, because it is possible to form the silicon nitride oxide film 32 and the semiconductor film 34 with the same film deposition method here, both films may be formed in succession in the same chamber. After the formation of the silicon nitride oxide film 32, it becomes possible to prevent contamination or the like of the surface by not exposing the substrate to the open atmosphere for a time during the conveying of the substrate. As a result, characteristic irregularities of the manufactured TFTs can be reduced.

Thereafter, a known crystallization technique is performed to thereby form a crystalline semiconductor film on the substrate with the laminate layer of the silicon nitride oxide film 32, the second insulating film 33, and the amorphous semiconductor film formed thereon.

Known techniques may be used for the remaining processes to form the TFT.

[Embodiment 4]

An explanation on a process of manufacturing the silicon nitride oxide film and the semiconductor film (crystalline silicon film in Embodiment 4) utilizing the present invention will be made. Embodiment 4 is shown in the following with reference to FIG. 4.

First of all, a first insulating film 42 is formed from, here, a silicon nitride oxide film to a thickness of 50 nm on a substrate 41 under the first conditions of the film deposition.

The first conditions of the film deposition are set as follows: substrate temperature is set to 320° C., the introducing amount of $SiH_4$ gas is set to about 80 sccm; the introducing amount of $N_2O$ gas is set to about 200 sccm; the introducing amount of $NH_3$ gas is set to about 720 sccm, the pressure inside the chamber is set to about 1.0 Torr, and the RF power that is to be inputted is set to about 1500 W.

Next, without setting the RF power to zero, the values of the pressure, the gas flow rate, and the RF output are continuously altered until they reach the values indicated by the second conditions of the film deposition, thereby forming a silicon nitride oxide film 43. The silicon nitride oxide film 43 is a film in which the concentration ratio of nitrogen to the concentration of silicon in the film or the concentration ratio of oxygen to the concentration of silicon in the film is undergoing a continuous change. Though the time for the continuous change to take place may be appropriately determined, it is set to 10 seconds in Embodiment 4.

The second conditions of the film deposition are set as follows: the substrate temperature is set to 320° C., the introducing amount of $SiH_4$ gas is set to about 30 sccm; the introducing amount of $N_2O$ gas is set to about 3000 sccm, the pressure inside the chamber is set to about 1.0 Torr, and the RF power that is to be inputted is set to about 500 W.

A second insulating film 44 is next formed under the second conditions of the film deposition without setting the RF power to zero. The second insulating film 44 here is the silicon nitride oxide film formed to a thickness of 100 nm.

Next, a semiconductor film 45 that is an amorphous silicon film here is formed on the second insulating film 44 and in contact thereto.

Further, because here it is possible to form the second insulating film 44 and the semiconductor film 45 with the same film deposition method, both films may be formed in succession in the same chamber. After the formation of the second insulating film 44, it becomes possible to prevent contamination of the surface by not exposing the substrate to the open atmosphere for a time during the conveying of the substrate. As a result, characteristic irregularities of the manufactured TFTs can be reduced.

Thereafter, a known crystallization technique is performed to thereby form a crystalline semiconductor film on the substrate with the laminate layer of the first insulating film 42, the silicon nitride oxide film 32, the second insulating film 44, and the amorphous semiconductor film formed thereon.

Known techniques may be used for the remaining processes to form the TFT.

[Embodiment 5]

An explanation on a process of manufacturing the silicon nitride oxide film and the semiconductor film (crystalline silicon film in Embodiment 5) utilizing the present invention will be made. Embodiment 5 is shown in the following with reference to FIG. 5.

First of all, a first insulating film 52, a silicon nitride oxide film 53, and a second insulating film 54 are formed on a substrate 51 in accordance with the processes of Embodiment 4. Since the processes until the formation of these films are the same as that of Embodiment 4, explanations thereof will be omitted here.

After obtaining the second insulating film 54, heat treatment is performed on the substrate under a nitrogen atmosphere at 640° C. for 4 hours by employment of an electric furnace. Heat stability can be secured through this heat treatment.

Subsequently, a silicon oxide film 55 is formed to a film thickness of 20 nm by plasma CVD with TEOS as the source material. It is to be noted that the silicon nitride oxide film may be formed instead of the silicon oxide film.

Next, a semiconductor film 56 that is an amorphous silicon film here is formed on the silicon oxide film 55 and in contact thereto.

Further, because here it is possible to form the silicon oxide film 55 and the semiconductor film 56 with the same film deposition method, both films may be formed in succession in the same chamber. After the formation of the silicon oxide film 55, it becomes possible to prevent contamination of the surface by not exposing the substrate to the open atmosphere for a time during the conveying of the substrate. As a result, characteristic irregularities of the manufactured TFTs can be reduced.

Thereafter, a known crystallization technique is carried out to thereby form a crystalline semiconductor film on the substrate with the laminate layer of the first insulating film 52, the silicon nitride oxide film 53, the second insulating film 54, the silicon oxide film 55 and the amorphous semiconductor film formed thereon.

Known techniques may be used for the remaining processes to form the TFT.

[Embodiment 6]

In this embodiment, a case where one embodiment of the present invention is applied to an active matrix liquid crystal display device will be described with reference to FIGS. 6 to 12.

Figure 6A:
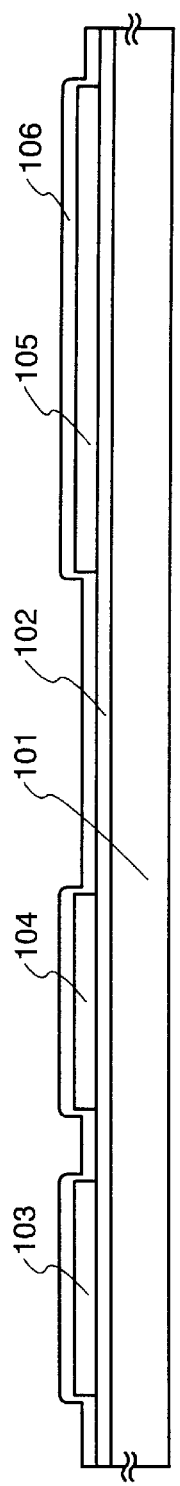
FIGS. 6A to 6C are diagrams showing manufacturing processes of an AM-LCD in accordance with Embodiment 6 of the present invention.

FIG. 6A is a cross sectional view, and reference numeral 101 shows an insulating substrate, for example, a substrate of 1737 glass made by Corning Inc. is used. On the glass substrate, a base film 102 comprising a silicon nitride oxide film in which a composition of nitrogen or oxygen undergoes a continuous change and an amorphous semiconductor film 103 are formed as a lamination film. As a method of forming the lamination film, any one of Embodiments 1 to 5 described above may be used. In Embodiment 6, the method shown in Embodiment 1 is used to form a base film having a thickness of 200 nm and an amorphous silicon film having a thickness of 50 nm.

Next, the amorphous silicon film is preferably heated at 400 to 550° C. for several hours to carry out a dehydrogenating process depending on the amount of hydrogen contained in the amorphous silicon film, so that the hydrogen content is made 5 atom % or less, and a step of crystallization is carried out.

As a step of crystallizing the amorphous silicon film, a well-known laser crystallization method or a thermal crystallization method may be used. In this embodiment, a pulse oscillation type KrF excimer laser light was linearly condensed and was irradiated to the amorphous silicon film to form a crystalline silicon film.

The thus formed crystalline silicon film was patterned by using a first photomask to form island-like semiconductor layers 103, 104 and 105.

Note that the crystalline silicon film is formed from the amorphous silicon film as the island-like semiconductor layer in this embodiment, however a microcrystal silicon film may be used, or a crystalline silicon film may be directly formed.

Next, a gate insulating film 106 containing silicon oxide or silicon nitride as its main component was formed to cover the island-like semiconductor layers 103, 104, and 105. As the gate insulating film 106, a silicon nitride oxide film having a thickness of 10 to 200 nm, preferably 50 to 150 nm may be formed by a plasma CVD method using $N_2O$ and $SiH_4$ as a source material. Here, the film was formed to a thickness of 100 nm. (FIG. 6A)

Then resist masks 107, 108, 109, 110 and 111 covering channel forming regions of the semiconductor layer 103 and the semiconductor layers 104 and 105 were formed through a second photomask. At this time, a resist mask 109 may be formed also in a region where the wiring is formed.

Figure 6B:
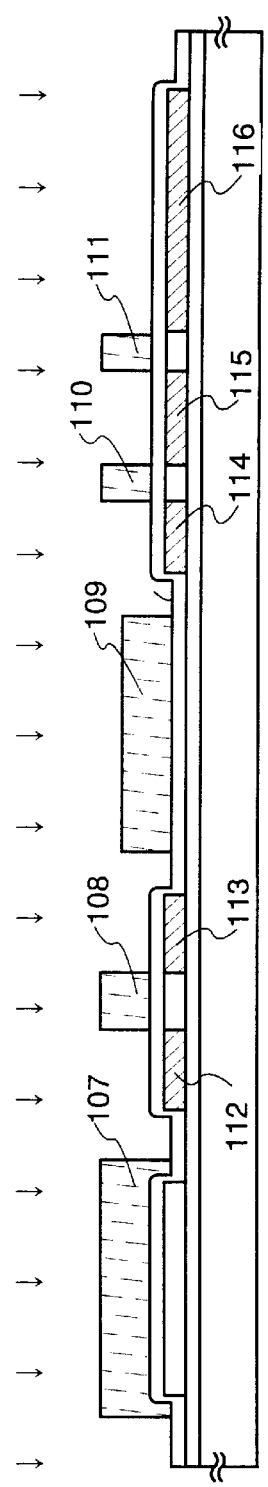

Then, a step of adding an impurity element which gives the n-type to form a second impurity region was carried out. Here, phosphorus was used and an ion doping method using phosphine ($PH_3$) was carried out. In this step, for the purpose of adding phosphorus through the gate insulating film 106 to a semiconductor layer thereunder, an acceleration voltage was set as high as 65 KeV. It is preferable that a concentration of phosphorus added in the semiconductor layer is made a value within the range of $1 \times 10^{16}$ to $1 \times 10^{19}$ atoms/$cm^3$, and here, it was made $1 \times 10^{18}$ atoms/$cm^3$. Then, regions 112, 113, 114, 115, and 116 where phosphorus (P) was added in the semiconductor layer were formed. Here, one part of the regions where phosphorus was added are made second impurity regions functioning as LDD regions (FIG. 6B).

Figure 6C:
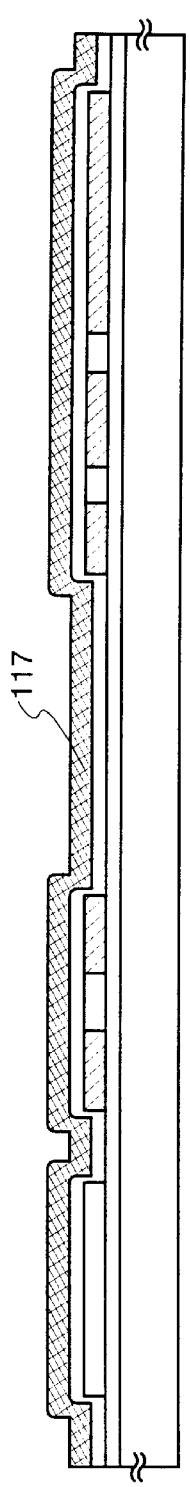

Thereafter, the resist masks were removed and a first conductive layer 117 was formed on the whole surface. As the first conductive layer 117, a conductive material containing an element selected from Ta, Ti, Mo, and W is used. It is appropriate that the first conductive layer 117 is formed to a thickness of 100 to 1,000 nm, preferably 150 to 400 nm. In this embodiment, Ta is formed by sputtering. (FIG. 6C)

Next, resist masks 118, 119, 120, 121, 122, and 123 were formed with a third photomask. The fourth photomask is for forming a gate electrode of a p-channel TFT, gate wirings of a CMOS circuit and a pixel portion, gate bus lines. Since a gate electrode of an n-channel TFT was formed in a later step, the resist masks 119 and 123 were formed so that the first conductive layer 117 remained on a whole surface of the semiconductor layer 104.

Unnecessary portions of the first conductive layer were removed by a dry etching method. Etching of Ta is performed by mixed gas of $CF_4$ and $O_2$. Then, a gate electrode 124, gate wirings 126 and 128, and a gate bus line 127 were formed.

A doping step of a third impurity element giving the p-type to a part of the semiconductor layer 103 where the p-channel TFT was to be formed was carried out while the resist masks 118, 119, 120, 121, 122, and 123 were made to remain as they were. In this embodiment, boron was used as the impurity element and was added by an ion doping method using diborane ($B_2H_6$). Also in this case, an acceleration voltage was made 80 keV, and boron was added at a concentration of $2 \times 10^{20}$ atoms/$cm^3$. As shown in FIG. 7A, third impurity regions 130 and 131 where boron was added at a high concentration were formed.

After the resist masks provided in FIG. 7A were removed, resist masks 132, 133, 134, 135, 136, 137, and 138 were newly formed with a fourth photomask. The fourth photomask is for forming gate electrodes of n-channel TFTs, and gate electrodes 139, 140, 141 and capacitance electrode 142 were formed by a dry etching method. At this time, the gate electrodes 139, 140, and 141 were formed to overlap with part of the second impurity regions 112, 113, 114, 115 and 116. (FIG. 7B)

After the resist masks were removed, new resist masks 143, 144, 145, 146, 147, 148, and 149 were formed. The resist masks 144, 147, and 148 were formed to cover the gate electrodes 139, 140, and 141 of the n-channel TFTs and part of the second impurity regions. The resist masks 144, 147, and 148 determine the offset amounts of LDD regions.

Then, a doping step of an impurity element giving the n-type was carried out to form a first impurity region. First impurity regions 151 and 152 which became source regions and first impurity regions 150, 153, and 154 which became drain regions were formed. Here, the step was carried out by an ion doping method using phosphine ($PH_3$). Also in this step, for the purpose of adding phosphorus through the gate insulating film 106 to the semiconductor layer under the film, an acceleration voltage was set as high as 80 KeV. A concentration of phosphorus in the regions is high as compared with the prior doping step of the first impurity element giving the n-type, and it is preferable that the concentration is made $1\times10^{19}$ to $1\times10^{21}$ atoms/cm$^3$, and here, it was made $1\times10^{20}$ atoms/cm$^3$. (FIG. 7C)

Figure 8:
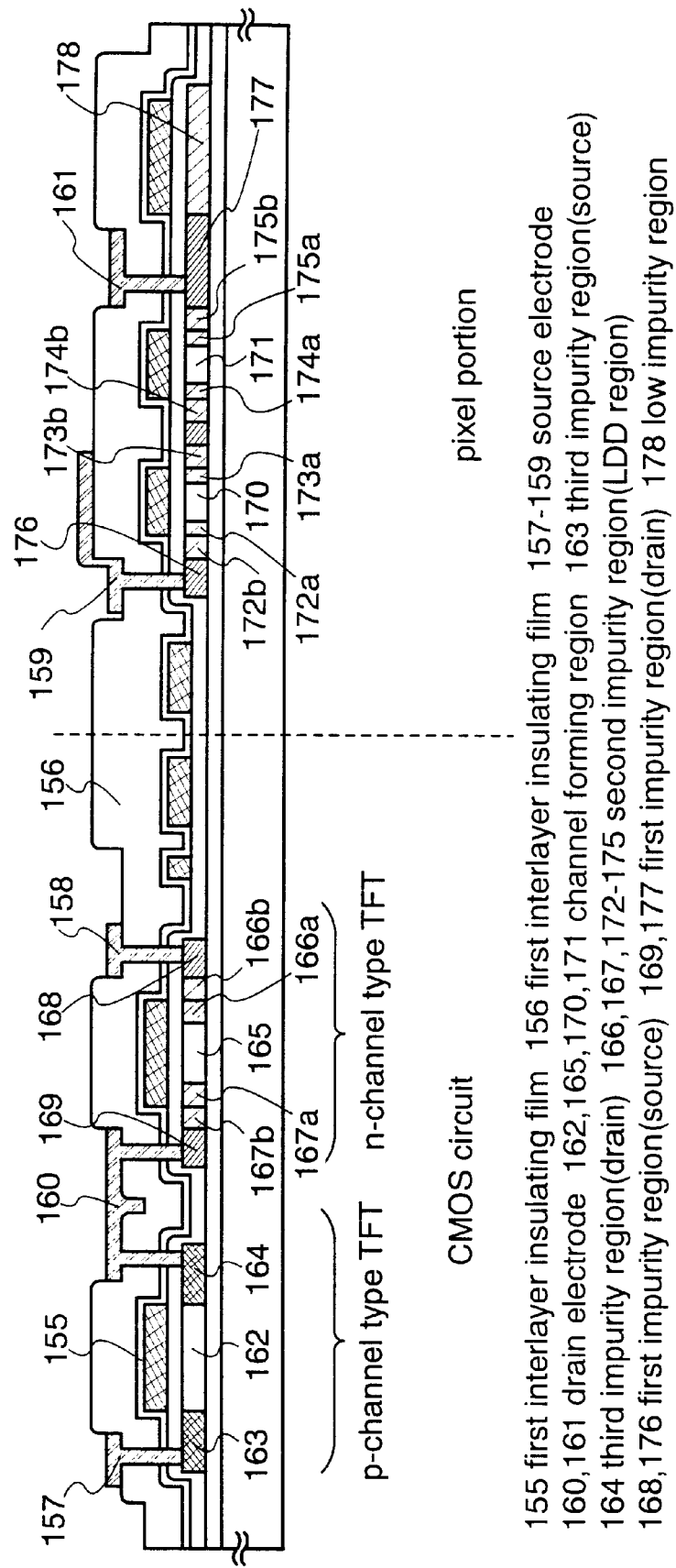
FIG. 8 is a diagram showing the manufacturing process of the AM-LCD in accordance with Embodiment 6 of the present invention.

After the steps up to FIG. 7C were completed, a step of forming first interlayer insulating films 155 and 156 was carried out. First, a silicon nitride film 155 was formed to be a lower layer to a thickness of 50 nm. The silicon nitride film 155 was formed by a plasma CVD method under the condition that $SiH_4$ of 5 SCCM, $NH_3$ of 40 SCCM, and $N_2$ of 100 SCCM were introduced, the pressure was made 0.7 Torr, and a high frequency power of 300 W was applied. Subsequently, as the first interlayer insulating film 156 to be an upper layer, a silicon oxide film having a thickness of 950 nm was formed under the condition that TEOS of 500 SCCM and $O_2$ of 50 SCCM were introduced, the pressure was made 1 Torr, and a high frequency power of 200 W was applied. (FIG. 8)

Then, a step of heat treatment was carried out. It was necessary to carry out the step of heat treatment to activate the impurity element added at each concentration to give the—type or p-type. This step may be carried out by a thermal annealing method using an electric heating furnace, the foregoing laser annealing method using an excimer laser, or a rapid thermal annealing method (RTA method) using a halogen lamp. Here, the step of activation was carried out by the thermal annealing method. The heat treatment was carried out in a nitrogen atmosphere at 300 to 700° C., preferably 350 to 550° C., here, 450° C. for 2 hours.

Thereafter, the first interlayer insulating films 155 and 156 were patterned to form contact holes reaching a source region and a drain region of each TFT. Then, source electrodes 157, 158, and 159 and drain electrodes 160 and 161 were formed. Although not shown, in this embodiment, the respective electrodes were formed as a three-layer electrode in which a Ti film having a thickness of 100 nm, an Al film containing Ti and having a thickness of 300 nm, and a Ti film having a thickness of 150 nm were continuously formed by a sputtering method.

Through the foregoing steps, a channel forming region 165, first impurity regions 168 and 169, and second impurity regions 166 and 167 were formed in the n-channel TFT of the CMOS circuit. Here, in the second impurity regions, regions (GOLD regions) 166a and 167a overlapping with the gate electrode and regions (LDD regions) 166b and 167b not overlapping with the gate electrode were formed, respectively. The first impurity region 168 became a source region and the first impurity region 169 became a drain region.

In the p-channel TFT, a channel forming region 162, and third impurity regions 163 and 164 were formed. Then, the third impurity region 163 became a source region and the third impurity region 164 became a drain region.

Further, the n-channel TFT of the pixel portion has a multi gate structure, and channel forming regions 170 and 171, first impurity regions 176 and 177, and second impurity regions 172, 173, 174 and 175 were formed. Here, in the second impurity regions, regions 172a, 173a, 174a and 175a overlapping with the gate electrode, and regions 172b, 173b, 174b and 175b not overlapping with the gate electrode were formed.

In this way, as shown in FIG. 8, an active matrix substrate in which the CMOS circuit and the pixel portion were formed over the substrate 101 was fabricated. At the same time, a storage capacitance was formed with a low concentration impurity region 178 to which an impurity element giving n-type is added at a same concentration as that of the second impurity region, a gate insulating film 106, and a capacitance electrode 142 at the drain side of the n-channel TFT of the pixel portion.

Then, a description will be made on a process of fabricating an active matrix type liquid crystal display device from an active matrix substrate.

A passivation film 179 was formed to the active matrix substrate in the state of FIG. 8. The passivation film 179 was made of a silicon nitride film having a thickness of 50 nm. Further, a second interlayer insulating film 180 made of organic resin was formed to a thickness of about 1,000 nm. As the organic resin film, polyimide, acryl, polyimidoamide, etc. may be used. As advantages obtained by using the organic resin film, it is possible to enumerate such points that a film formation method is simple, parasitic capacitance can be reduced since its relative dielectric constant is low, and flatness is superior. An organic resin film other than the above may be used. Here, polyimide of such a type that thermal polymerization was made after application to the substrate was used, and was fired at 300° C. to form the film. (FIG. 9A)

Further, a third interlayer insulating film 181 was formed. The third interlayer insulating film 181 was formed by using an organic resin film of polyimide or the like. Then, a contact hole reaching the drain electrode 161 was formed by selectively removing the third interlayer insulating film 181, the second interlayer insulating film 180, and the passivation film 179, and a pixel electrode 182 was formed. With respect to the pixel electrode 182, it is appropriate that a transparent conductive film is used in the case where a transmission type liquid crystal display device is formed, and a metal film is used in the case where a reflection type liquid crystal display device is formed. Here, for the purpose of making the transmission type liquid crystal display device, an indium-tin oxide (ITO) film having a thickness of 100 nm was formed by a sputtering method and patterning is performed, so that the pixel electrode 182 was formed. (FIG. 9B)

Figure 10:
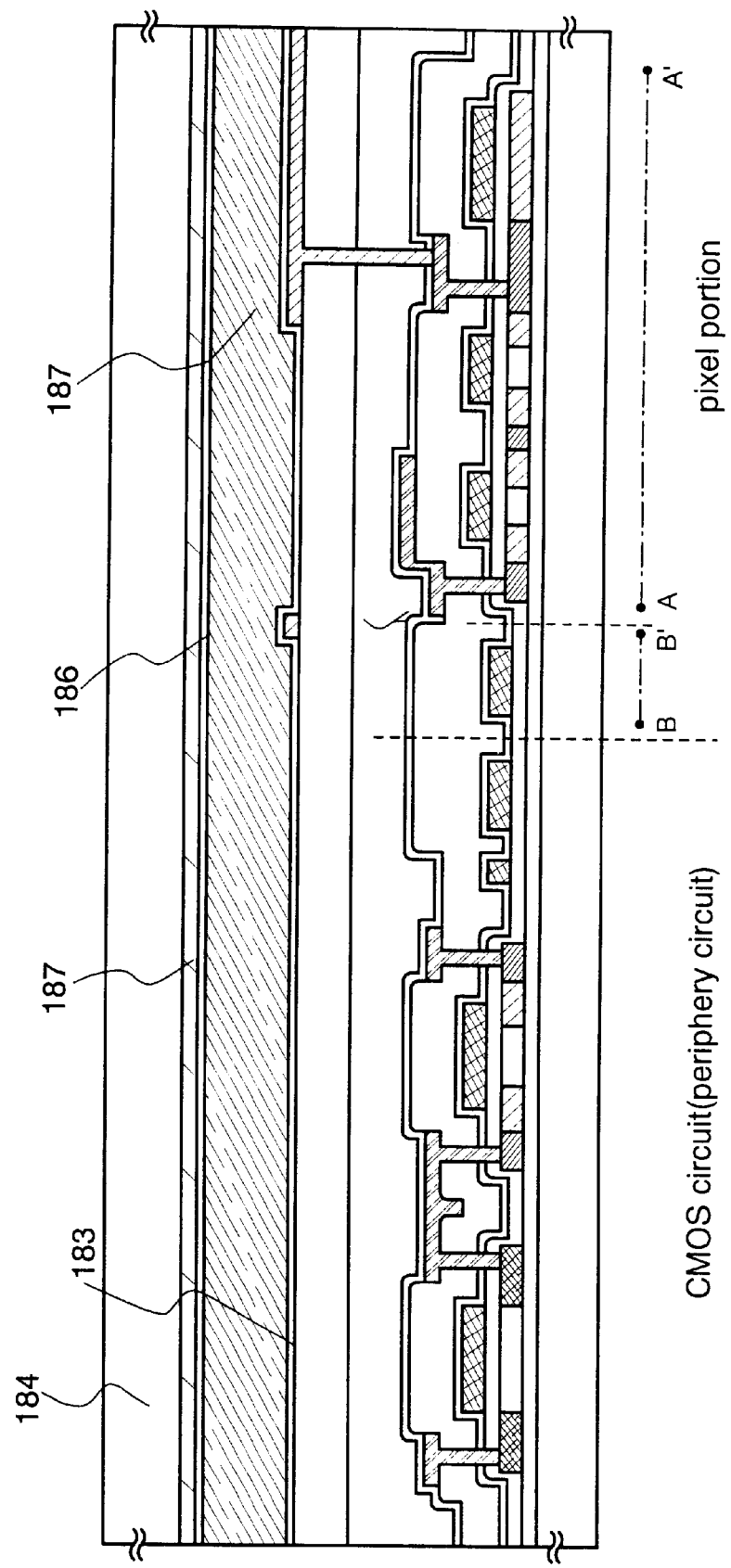
FIG. 10 is a view showing a cross-sectional structure of the active matrix liquid crystal display device in accordance with Embodiment 6 of the present invention.

Next, as shown in FIG. 10, an orientation film 183 was formed on the third interlayer insulating film 181 and the pixel electrode 182. In general, a polyimide resin is often used for an orientation film of a liquid crystal display device. A transparent conductive film 185 and an orientation film 186 were formed on an opposite side substrate 184. The orientation film was subjected to a rubbing process after formation so that liquid crystal molecules were made to be oriented in parallel and with a certain pretilt angle.

After the foregoing steps, the active matrix substrate on which the pixel portion and the CMOS circuit were formed and the opposite substrate were bonded to each other by a well-known cell assembling step through a sealing material, a spacer (both are not shown), and the like. Thereafter, a liquid crystal material 187 was injected between both of the substrates, and complete sealing was made by a sealing agent (not shown). Thus, the active matrix type liquid crystal display device shown in FIG. 10 was completed.

Figure 11:
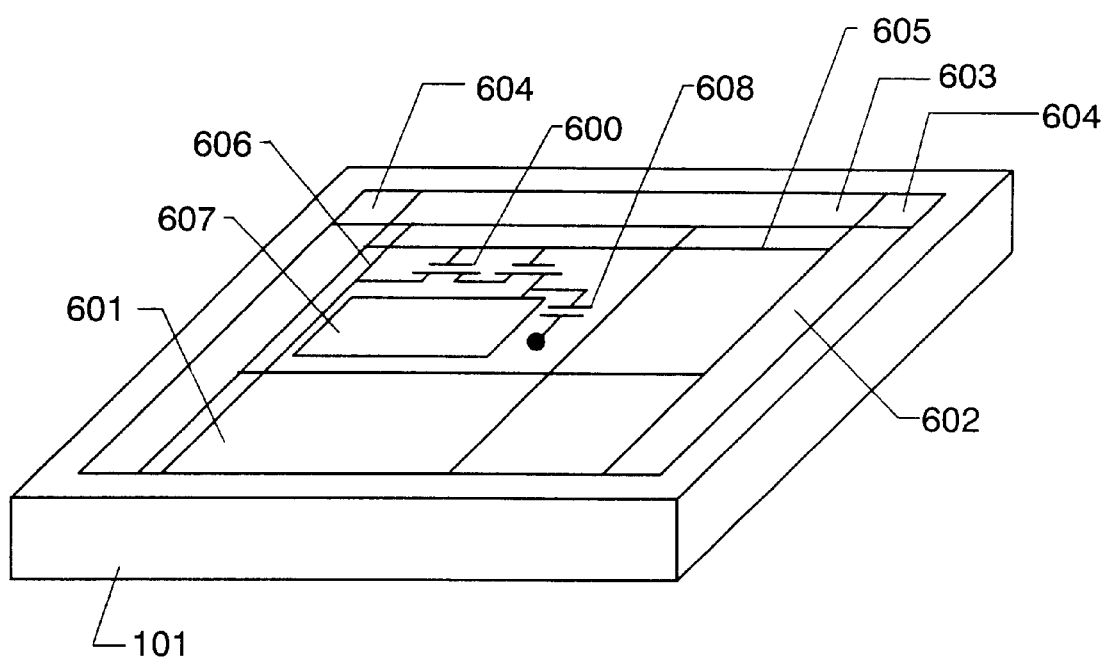
FIG. 11 is view showing an outer appearance of the AM-LCD of Embodiment 6 of the present invention.

Next, a structure of an active matrix type liquid crystal display device of this embodiment will be described with reference to FIGS. 11 and 12. FIG. 11 is a perspective view of an active matrix substrate of this embodiment. The active matrix substrate is constructed by a pixel portion 601, a scanning (gate) line driver circuit 602, a signal (source) line driver circuit 603, and a logic circuit 604 formed on a glass substrate 101. A pixel TFT 600 of a pixel portion is an n-channel TFT, and the driver circuits provided at the periphery comprise a CMOS circuit as a base. The scanning (gate) line driver circuit 602 and the signal (source) line driver circuit 603 are connected to the pixel portion 601 through a gate wiring 605 and a source wiring 606, respectively. The pixel portion 601 is formed with a pixel TFT 600, a pixel electrode 607, and a storage capacitance 608.

In this embodiment, although the pixel TFT 600 has a double gate structure, a single gate structure may be adopted, or a multi gate structure of a triple gate may be adopted. The structure of the active matrix substrate is not limited to the structure of this embodiment. Since the structure of the present invention is characterized in the structure of a base film, other structures may be suitably determined by an operator.

Figure 12:
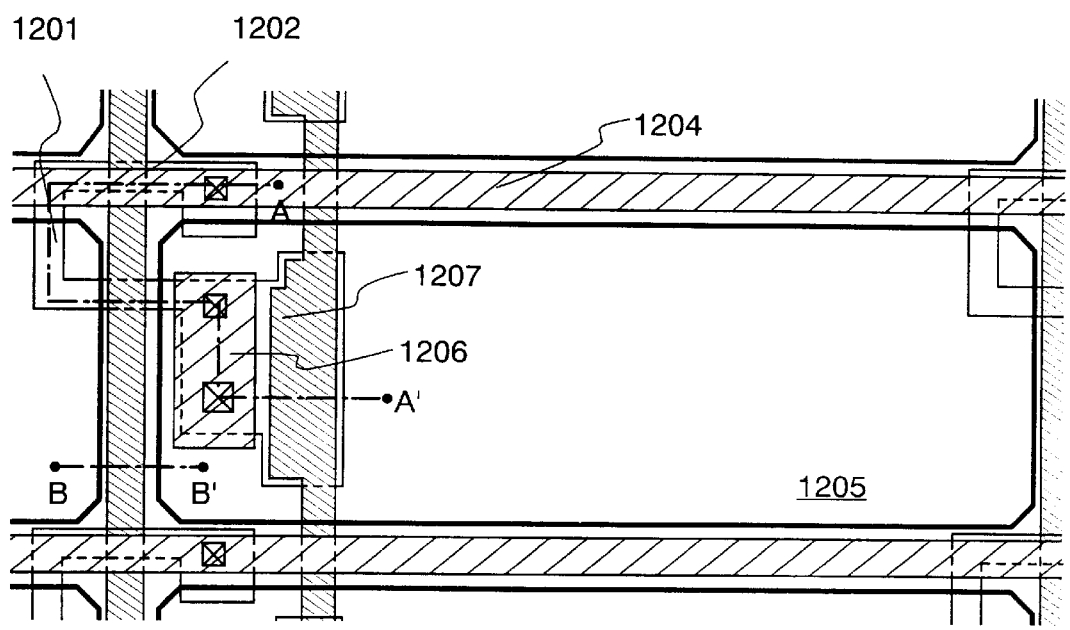
FIG. 12 is a diagram showing a portion of a top view of a pixel portion in accordance with Embodiment 6 of the present invention.

FIG. 12 is a top view of the pixel portion 601 and is a top view of almost one pixel. The pixel portion is provided with an n-channel TFT. A gate electrode 1202 intersects through a not-shown gate insulating film with a semiconductor layer 1201 thereunder. Although not shown, a source region, a drain region, and a first impurity region are formed in the semiconductor layer. At a drain side of the pixel TFT, a storage capacitance 1207 comprises the semiconductor layer, the gate insulating film, and an electrode made of the same material as the gate electrode. A sectional structure along line A–A' and line B–B' shown in FIG. 12 corresponds to the sectional view of the pixel portion shown in FIG. 10.

[Embodiment 7]

In this embodiment, a description will be made on an example where a crystalline semiconductor film used as the semiconductor layer in the embodiment 6 is formed by a thermal crystallization method using a catalytic element. In the case where the catalytic element is used, it is desirable to use a technique disclosed in Japanese Patent Application Laid-open No. Hei. 7-130652 or Hei. 8-78329.

Here, an example of a case where the technique disclosed in Japanese Patent Application Laid-open No. Hei. 7-130652 is applied to the present invention will be described in FIG. 13. First, a base film 1302 comprising a silicon nitride oxide film in which a composition of nitrogen or oxygen undergoes a continuous change was formed on a substrate 1301 and an amorphous silicon film 1303 was formed thereon. As a method of forming the lamination film, any one of Embodiments 1 to 5 described above may be used. In Embodiment 7, the method shown in Embodiment 1 is used to form a base film having a thickness of 250 nm and an amorphous silicon film having a thickness of 50 nm.

Figure 13A:
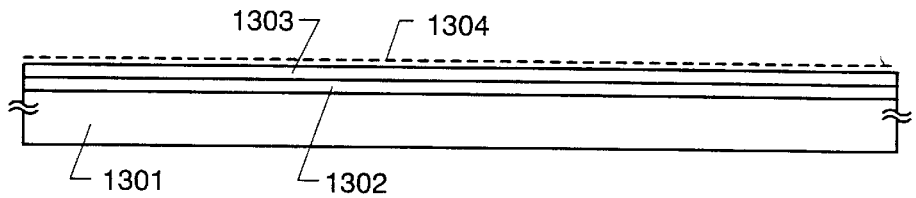
FIGS. 13A and 13B are diagrams showing manufacturing processes of an AM-LCD in accordance with Embodiment 7 of the present invention.

Thereafter, a nickel acetate salt solution containing nickel of 10 ppm in terms of weight was applied, thereby forming a nickel containing layer 1304. (FIG. 13A)

Figure 13B:
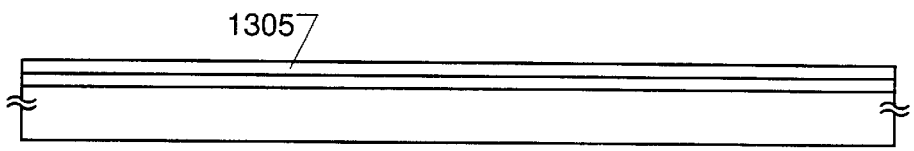

Next, after a dehydrogenating step at 500° C. for 1 hour was carried out, a heat treatment at 500 to 650° C. for 4 to 12 hours, for example, at 550° C. for 8 hours was carried out, so that a crystalline silicon film 1305 was formed. The crystalline silicon film 1305 obtained in this way had extremely superior crystallinity. (FIG. 13B)

The technique disclosed in Japanese Patent Application Laid-open No. Hei. 8-78329 is such that selective crystallization of an amorphous semiconductor film is made possible by selectively adding a catalytic element. A case where the technique is applied to the present invention will be described with reference to FIG. 14.

First, a base film 1402 comprising a silicon nitride oxide film in which a composition of nitrogen or oxygen undergoes a continuous change was formed on a glass substrate 1401 and an amorphous silicon film 1403 and a silicon oxide film 1404 were continuously formed thereon. At this time, the thickness of the silicon oxide film 1404 was made 150 nm. As a method of forming the base film 1402, any one of Embodiments 1 to 5 described above may be used. In Embodiment 7, the method shown in Embodiment 2 is used to form a base film.

Figure 14A:
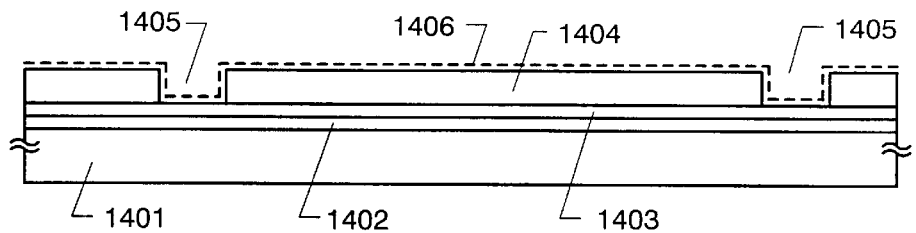
FIGS. 14A and 14B are diagrams showing the manufacturing processes of the AM-LCD in accordance with Embodiment 7 of the present invention.

Next, the silicon oxide film 1404 was patterned to selectively form opening portions 1405. Thereafter, a nickel acetate salt solution containing nickel of 10 ppm in terms of weight was applied. By this, a nickel containing layer 1406 was formed, and the nickel containing layer 1406 was brought into contact with the amorphous silicon film 1902 at only the bottoms of the opening portions 1405 (FIG. 14A).

Figure 14B:
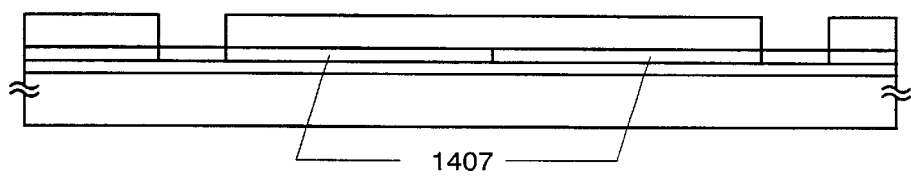

Next, a heat treatment at 500 to 650° C. for 4 to 24 hours, for example, at 570° C. for 14 hours was carried out, so that a crystalline silicon film 1407 was formed. In this crystallizing process, a portion of an amorphous silicon film with which nickel is in contact is first crystallized, and crystal growth progresses in the lateral direction therefrom. The thus formed crystalline silicon film 1407 comprises a collective of rod-like or needle-like crystals, and each crystal macroscopically grows with certain directionality. Thus, there is an advantage that crystallinity is uniform (FIG. 14B).

In the foregoing two techniques, instead of nickel (Ni), a catalytic element such as germanium (Ge), iron (Fe), palladium (Pd), tin (Sn), lead (Pb), cobalt (Co), platinum (Pt), copper (Cu), or gold (Au) may be used.

If a crystalline semiconductor film (including a crystalline silicon film, a crystalline silicon germanium film, etc.) is formed by using the technique as described above, and patterning is carried out, a semiconductor layer of a crystalline TFT can be formed. Although superior characteristics can be obtained in the TFT fabricated from the crystalline semiconductor film by using the technique of this embodiment, high reliability has been required because of that. However, when the TFT structure of the present invention is adopted, it becomes possible to fabricate a TFT which utilizes the technique of this embodiment to the utmost.

[Embodiment 8]

In this embodiment, a description will be made on an example in which as a method of forming a semiconductor layer used in the embodiment 6, after a crystalline semiconductor film is formed using an amorphous semiconductor film as an initial film and using a catalytic element, a step of removing the catalytic element from the crystalline semiconductor film is carried out. As a method thereof, this embodiment uses a technique disclosed in Japanese Patent Application Laid-open No. Hei 10-135468, or Hei 10-135469.

The technique disclosed in the publications is such that a catalytic element used for crystallization of an amorphous semiconductor film is removed after crystallization by using a gettering function of phosphorus. By using the technique, it is possible to reduce a concentration of a catalytic element in a crystalline semiconductor film to $1 \times 10^{17}$ atoms/cm$^3$ or less, preferably $1 \times 10^{16}$ atoms/cm$^3$ or less.

Figure 15A:
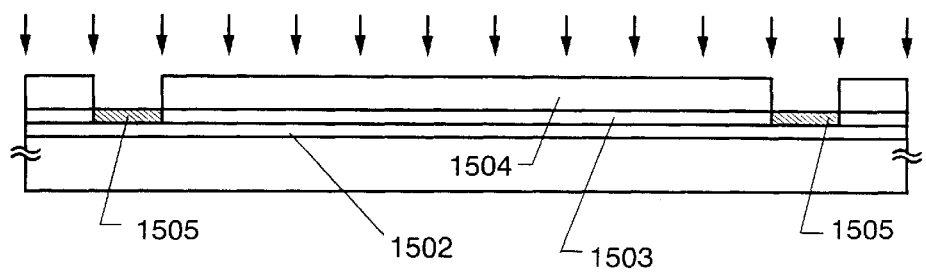
FIGS. 15A and 15B are diagrams showing manufacturing processes of an AM-LCD in accordance with Embodiment 8 of the present invention.
Figure 15B:
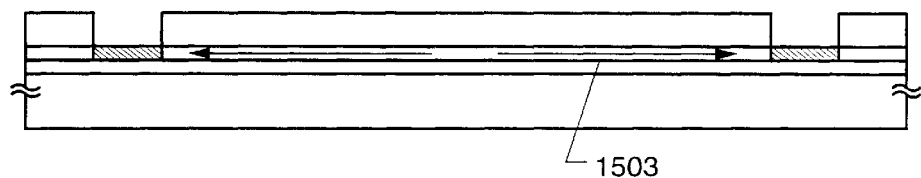

A structure of this embodiment will be described with reference to FIG. 15. Here, an alkali-free glass substrate typified by a substrate of 1737 glass made by Corning Inc. was used. FIG. 15A shows a state in which a base film 1502 and a crystalline silicon film 1503 were formed by using the technique disclosed in the embodiment 7. As a method of forming the base film 1502, any one of Embodiments 1 to 5 described above may be used. Then, a silicon oxide film 1504 for masking was formed to a thickness of 150 nm on the surface of the crystalline silicon film 1503, and opening portions were provided by patterning, so that regions where the crystalline silicon film was exposed were provided. Then, a step of adding phosphorus was carried out so that a region 1505 added with phosphorus was provided in the crystalline silicon film.

In this state, when a heat treatment at 550 to 800° C. for 5 to 24 hours, for example, at 600° C. for 12 hours was carried out in a nitrogen atmosphere, the region 1505 where phosphorus was added in the crystalline silicon film functioned as a gettering site, so that it was possible to segregate the catalytic element remaining in the crystalline silicon film 1503 into the region 1505 added with phosphorus.

By removing the silicon oxide film 1504 for masking and the region 1505 added with phosphorus with etching, it was possible to obtain a crystalline silicon film in which the concentration of the catalytic element used in the step of crystallization was reduced to $1 \times 10^{17}$ atoms/cm$^3$ or less. It was possible to use this crystalline silicon film without any change as the semiconductor layer of the TFT of the present invention described in the embodiment 6.

[Embodiment 9]

CMOS circuits and pixel portions formed by implementing the present invention can be used in various electro-optical devices (typically, an active matrix liquid crystal display device and the like). Namely, the present invention can be implemented in all electronic apparatus in which these electro-optical devices are built into a display portion.

The following can be given as such electronic apparatus: a video camera, a digital camera, a projector (rear type or front type), a head-mounted display (a goggle type display), a car navigation system, a car stereo, a personal computer, and a portable information terminal (such as a mobile computer, a portable telephone or an electronic book). Examples of these are shown in FIGS. 16, 17 and 18.

FIG. 16A is a personal computer, and it includes a main body 2001, an image input portion 2002, a display portion 2003, and a keyboard 2004, etc. The present invention can be applied to the image input portion 2002, the display portion 2003 or other signal controlling circuits.

FIG. 16B is a video camera, and it includes a main body 2101, a display portion 2102, an audio input portion 2103, operation switches 2104, a battery 2105, and an image receiving portion 2106, etc. The present invention can be applied to the display portion 2102 or other signal controlling circuits.

FIG. 16C is a mobile computer, and it includes a main body 2201, a camera portion 2202, an image receiving portion 2203, operation switches 2204, and a display portion 2205. The present invention can be applied to the display portion 2205 or other signal controlling circuits.

FIG. 16D is a goggle type display, and it includes a main body 2301, a display portion 2302, an arm portion 2303, etc. The present invention can be applied to the display portion 2302 or other signal controlling circuits.

FIG. 16E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other signal controlling circuits.

FIG. 16F is a digital camera, and it includes a main body 2501, a display portion 2502, an eyepiece portion 2503, operation switches 2504, and an image receiving portion (not shown in the figure), etc. The present invention can be applied to the display portion 2502 or other signal controlling circuits.

Figure 17A:
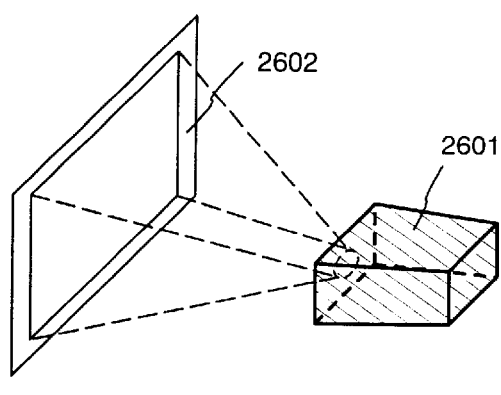
FIGS. 17A to 17D are views showing examples of electronic equipments of Embodiment 9 of the present invention.

FIG. 17A is a front projector, and it includes a projection system 2601, a screen 2602, etc. The present invention can be applied to a liquid crystal display device 2808 which constitutes a part of the projection system 2601, or other signal controlling circuits.

Figure 17B:
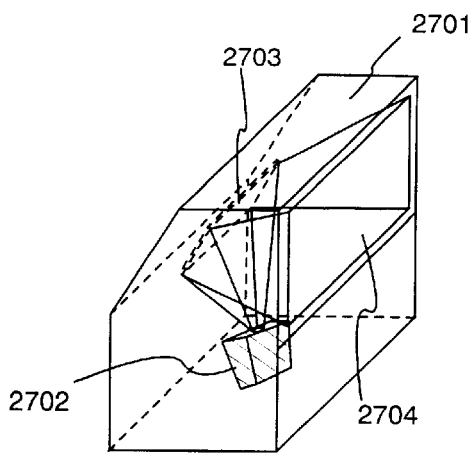

FIG. 17B is a rear projector, and it includes a main body 2701, a projection system 2702, a mirror 2703, a screen 2704, etc. The present invention can be applied to a liquid crystal display device 2808 which constitutes a part of the projection system 2702 or other signal controlling circuits.

Figure 17C:
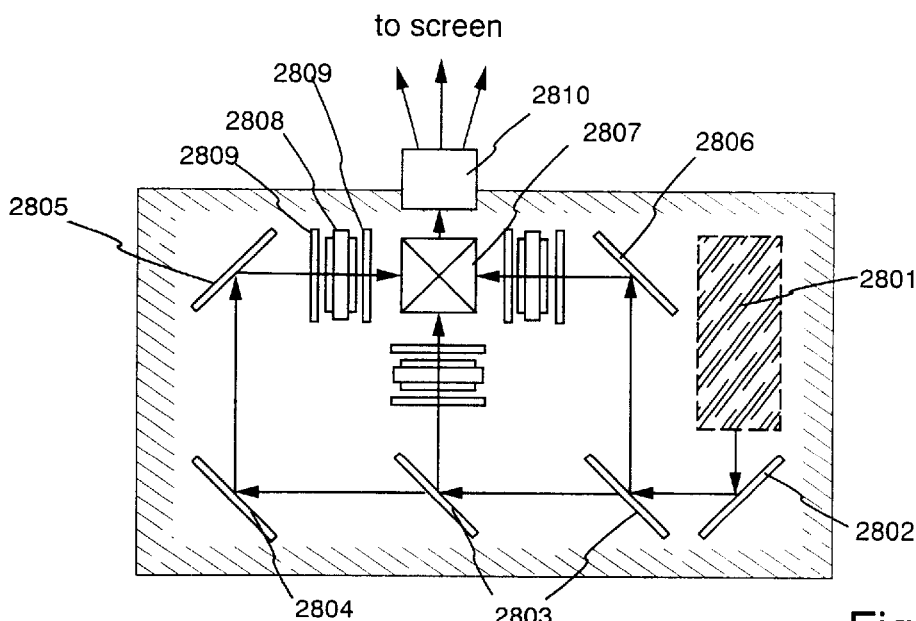

Note that FIG. 17C is a diagram showing an example of the structure of projection systems 2601 and 2702 of FIGS. 17A and 17B. The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present Embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 17C.

Figure 17D:
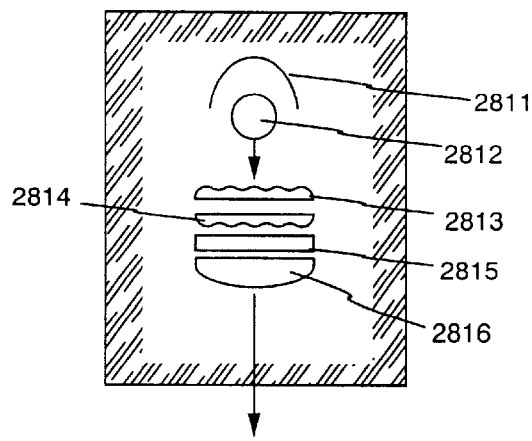

FIG. 17D is a diagram showing an example of the structure of the optical light source system 2801 of FIG. 17C. In the present Embodiment the optical light source system 2801 comprises a reflector 2811, a light source 2812, lens arrays 2813 and 2814, light polarizing conversion element 2815 and a condenser lens 2816. Note that the optical light source system shown in FIG. 17D is merely an example and is not specifically limited. For example, the operator may appropriately dispose an optical system such as an optical lens, a film having light polarizing function, a film for adjusting phase difference and an IR film, etc., in the optical light source system.

Provided however, the projectors shown in FIG. 17 show a case of using a transmission type electro-optical device and an application example of a reflection type electro-optical device is not shown in the figures.

Figure 18A:
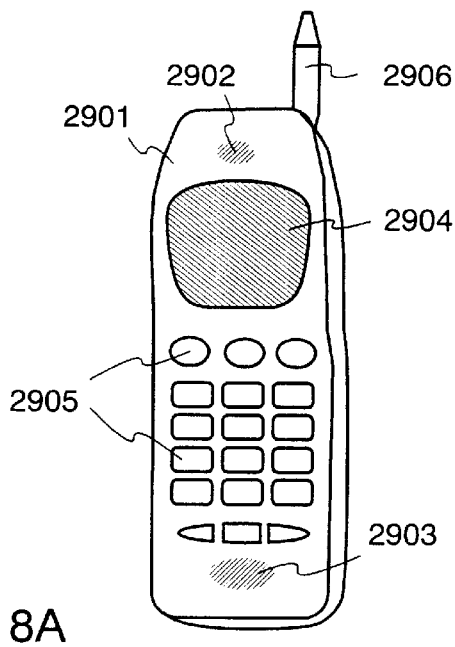
FIGS. 18A to 18C are views showing examples of electronic equipments of Embodiment 9 of the present invention.

FIG. 18A is a portable telephone, and it includes a main body 2901, an audio output portion 2902, an audio input portion 2903, a display portion 2904, operation switches 2905, and an antenna 2906, etc. The present invention can be applied to the audio output portion 2902, the audio input portion 2903, the display portion 2904 or other signal controlling circuits.

Figure 18B:
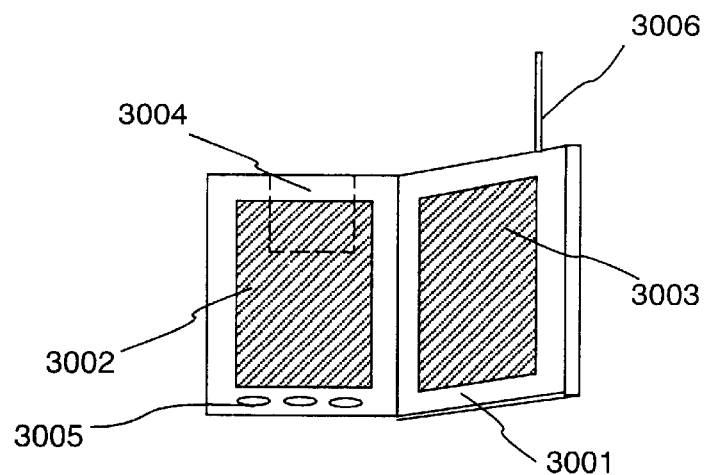

FIG. 18B is a portable book (electronic book), and it includes a main body 3001, display portions 3002 and 3003, a recording medium 3004, operation switches 3005, and an antenna 3006, etc. The present invention can be applied to the display portions 3002 and 3003 or other signal controlling circuits.

Figure 18C:
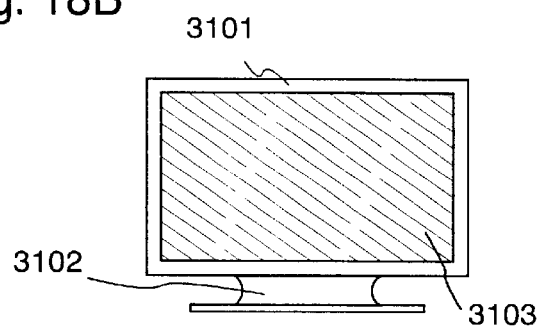

FIG. 18C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic apparatus in all fields. Further, the electronic apparatus of this embodiment can be realized by using a constitution of any combination of embodiments 1 to 8.

Therefore, from TFT characteristics so far, it is possible to make remarkable progress in the electric characteristic of the thus obtained TFT using the semiconductor film, which is formed on the base film containing the silicon nitride oxide film of the present invention, as an active layer.

What is claimed is:

1. A method of manufacturing a semiconductor device, comprising the steps of:
    forming a silicon nitride oxide film formed over a substrate; and
    forming a semiconductor film formed over said silicon nitride oxide film,
    wherein a concentration ratio of nitrogen to silicon in said silicon nitride oxide film undergoes a continuous change within a range of 0.3 to 1.6 by continuously altering a gas flow rate.

2. A method of manufacturing a semiconductor device, comprising the steps of:
    forming a silicon nitride oxide film formed over a substrate; and
    forming a semiconductor film formed over said silicon nitride oxide film,
    wherein a concentration ratio of oxygen to silicon in said silicon nitride oxide film undergoes a continuous change within a range of 0.1 to 1.7 by continuously altering a gas flow rate.

3. A method of manufacturing a semiconductor device, comprising the steps of:
    forming a silicon nitride oxide film formed over a substrate; and
    forming a semiconductor film formed over said silicon nitride oxide film,
    wherein a concentration ratio of nitrogen to silicon in said silicon nitride oxide film undergoes a continuous change within a range of 0.3 to 1.6 by continuously altering a gas ratio.

4. A method of manufacturing a semiconductor device, comprising the steps of:
    forming a silicon nitride oxide film formed over a substrate; and
    forming a semiconductor film formed over said silicon nitride oxide film,
    wherein a concentration ratio of oxygen to silicon in said silicon nitride film undergoes a continuous change within a range of 0.1 to 1.7 by continuously altering a gas ratio.

5. A method of manufacturing a semiconductor device, comprising the steps of:
    forming a silicon nitride oxide film formed over a substrate; and
    forming a semiconductor film formed over said silicon nitride oxide film,
    wherein a concentration ratio of nitrogen to silicon in silicon nitride oxide film undergoes a continuous change within a range of 0.3 to 1.6 by continuously altering an RF output.

6. A method of manufacturing a semiconductor device, comprising the steps of:
    forming a silicon nitride oxide film formed over a substrate; and
    forming a semiconductor film formed over said silicon nitride oxide film,
    wherein a concentration ratio of oxygen to silicon in said silicon nitride oxide film undergoes a continuous change within a range of 0.1 to 1.7 by continuously altering an RF output.

7. A method of manufacturing a semiconductor device, comprising the steps of:
    forming a silicon nitride oxide film formed over a substrate; and
    forming a semiconductor film formed over said silicon nitride oxide film,
    wherein a concentration ratio of nitrogen to silicon in said silicon nitride oxide film undergoes a continuous change within a range of 0.3 to 1.6, and
    wherein said silicon nitride oxide film and said semiconductor film are formed consecutively in a same chamber.

8. A method of manufacturing a semiconductor device, comprising the steps of:
    forming a silicon nitride oxide film formed over a substrate; and
    forming a semiconductor film formed over said silicon nitride oxide film,
    wherein a concentration ratio of oxygen to silicon in said silicon nitride oxide film undergoes a continuous change within a range of 0.1 to 1.7, and
    wherein said silicon nitride oxide film and said semiconductor film are formed consecutively in a same chamber.

9. A method of manufacturing a semiconductor device, comprising the steps of:
    forming an insulating film formed over a substrate;
    forming a silicon nitride oxide film formed over said insulating film; and
    forming a semiconductor film formed over said silicon nitride oxide film,
    wherein a concentration ratio of nitrogen to silicon in said silicon nitride oxide film undergoes a continuous change within a range of 0.3 to 1.6, and
    wherein said silicon nitride oxide film and said semiconductor film are formed consecutively in a same chamber.

10. A method of manufacturing a semiconductor device, comprising the steps of:
    forming an insulating film formed over a substrate;
    forming a silicon nitride oxide film formed over said insulating film; and
    forming a semiconductor film formed over said silicon nitride oxide film,
    wherein a concentration ratio of oxygen to silicon in said silicon nitride oxide film undergoes a continuous change within a range of 0.1 to 1.7, and wherein said silicon nitride oxide film and said semiconductor film are formed consecutively in a same chamber.

11. A method of manufacturing a semiconductor device, comprising the steps of;

forming a silicon nitride oxide film formed over a substrate;

forming an insulating film formed over said silicon nitride oxide film; and forming a semiconductor film formed over said insulating film, wherein a concentration ratio of nitrogen to silicon in said silicon nitride oxide film undergoes a continuous change within a range of 0.3 to 1.6, and wherein said silicon nitride oxide film, said insulating film and said semiconductor film are formed consecutively in a same chamber.

12. A method of manufacturing a semiconductor device, comprising the steps of:

forming a silicon nitride oxide film formed over a substrate;

forming an insulating film formed over said silicon nitride oxide film; and forming a semiconductor film formed in contact with said insulating film, wherein a concentration ratio of oxygen to silicon in said silicon nitride oxide film undergoes a continuous change within a range of 0.1 to 1.7, and wherein said silicon nitride oxide film, said insulating film and said semiconductor film are formed consecutively in a same chamber.

13. A method of manufacturing a semiconductor device, comprising the steps of:

forming a first insulating film formed over a substrate;

forming a silicon nitride oxide film formed over said first insulating film; and forming a second insulating film formed over said silicon nitride oxide film, wherein a concentration ratio of nitrogen to silicon in said silicon nitride oxide film undergoes a continuous change within a range of 0.3 to 1.6, and wherein said silicon nitride oxide film and said second insulating film are formed consecutively in a same chamber.

14. A method of manufacturing a semiconductor device, comprising the steps of:

forming a first insulating film formed over a substrate;

forming a silicon nitride oxide film formed over said first insulating film;

forming a second insulating film formed over said silicon nitride oxide film; and forming a semiconductor film formed over said second insulating film, wherein a concentration ratio of oxygen to silicon in said silicon nitride oxide film undergoes a continuous change within a range of 0.1 to 1.7, and wherein said silicon nitride oxide film, said second insulating film and said semiconductor film are formed consecutively in a same chamber.

15. A method of manufacturing a semiconductor device according to any one of claims 1, 3, 5, 7, 9, 11 and 13 wherein said concentration ratio of nitrogen to silicon in said silicon nitride oxide film continuously decreases toward an interface of said semiconductor film side.

16. A method of manufacturing a semiconductor device according to any one of claims 2, 4, 6, 8, 10, 12 and 14, wherein said concentration ratio of oxygen to silicon in said silicon nitride oxide film continuously increases toward an interface of said semiconductor film side.

* * * * *

UNITED STATES PATENT AND TRADEMARK OFFICE
CERTIFICATE OF CORRECTION

PATENT NO. : 6,632,708 B2
DATED : October 14, 2003
INVENTOR(S) : Mitsunori Sakama et al.

It is certified that error appears in the above-identified patent and that said Letters Patent is hereby corrected as shown below:

<u>Title page,</u>
Item [75], Inventors, please change "Mitinori Iwai" to -- Michinori Iwai --.
After Item [22], please add Foreign Application Priority Data as follows:
-- [30]   Foreign Application Priority Data
Dec. 20, 1999  (JP)  Japan … 11-360882 --

Signed and Sealed this

Thirtieth Day of March, 2004

JON W. DUDAS
*Acting Director of the United States Patent and Trademark Office*